(12) United States Patent
Hashimoto et al.

(10) Patent No.: US 8,642,715 B2
(45) Date of Patent: Feb. 4, 2014

(54) POLYESTER FILM AND METHOD FOR PRODUCING SAME, BACKSHEET FOR SOLAR CELL, AND SOLAR CELL MODULE

(75) Inventors: Kiyokazu Hashimoto, Ashigarakami-gun (JP); Yasutomo Goto, Ashigarakami-gun (JP); Kenji Kano, Ashigarakami-gun (JP)

(73) Assignee: FUJIFILM Corporation, Tokyo (JP)

( * ) Notice: Subject to any disclaimer, the term of this patent is extended or adjusted under 35 U.S.C. 154(b) by 287 days.

(21) Appl. No.: 13/158,143

(22) Filed: Jun. 10, 2011

(65) Prior Publication Data
US 2011/0306747 A1 Dec. 15, 2011

(30) Foreign Application Priority Data

Jun. 11, 2010 (JP) ................................. 2010-134470
May 31, 2011 (JP) ................................. 2011-122235

(51) Int. Cl.
*B32B 27/36* (2006.01)
*C08G 63/02* (2006.01)
*C08G 63/12* (2006.01)
*C08G 63/127* (2006.01)
*C08G 63/16* (2006.01)
*C08G 63/18* (2006.01)
*C08G 63/181* (2006.01)
*C08G 63/183* (2006.01)

(52) U.S. Cl.
USPC ..... 528/308; 528/272; 528/308.1; 528/308.6; 428/480

(58) Field of Classification Search
None
See application file for complete search history.

(56) References Cited

U.S. PATENT DOCUMENTS

| | | | |
|---|---|---|---|
| 5,731,071 A * | 3/1998 | Etchu et al. | 428/220 |
| 6,939,616 B2 * | 9/2005 | Hayakawa et al. | 428/480 |
| 7,022,388 B2 * | 4/2006 | Hashimoto et al. | 428/34.9 |
| 2008/0102260 A1 * | 5/2008 | Hongu et al. | 428/215 |
| 2010/0000603 A1 * | 1/2010 | Tsuzuki et al. | 136/259 |

FOREIGN PATENT DOCUMENTS

| | | |
|---|---|---|
| JP | 61-241127 A | 10/1986 |
| JP | 03-65778 B2 | 11/1986 |
| JP | 61-261026 A | 11/1986 |
| JP | 62-55900 A | 3/1987 |
| JP | 03-060301 B2 | 10/1987 |
| JP | 62-233228 A | 10/1987 |
| JP | 62-270327 A | 11/1987 |
| JP | 63-67558 A | 3/1988 |
| JP | 63-204577 A | 8/1988 |
| JP | 04-60424 B2 | 11/1988 |
| JP | 08-30119 B2 | 11/1988 |
| JP | 02-194924 A | 8/1990 |
| JP | 2543624 B2 | 7/1992 |
| JP | 04-286564 A | 10/1992 |
| JP | 3335683 B2 | 6/1994 |
| JP | 07-253638 * | 10/1995 |
| JP | 08-133537 A | 5/1996 |
| JP | 08-187777 A | 7/1996 |
| JP | 08-225199 A | 9/1996 |
| JP | 2000-177890 A | 6/2000 |
| JP | 4159154 B2 | 6/2000 |
| JP | 3717380 B2 | 4/2001 |
| JP | 3780137 B2 | 8/2001 |
| JP | 4000867 B2 | 12/2002 |
| JP | 3897756 B2 | 1/2003 |
| JP | 3962226 B2 | 1/2003 |
| JP | 2003-201047 A | 7/2003 |
| JP | 2003-211538 A | 7/2003 |
| JP | 3436268 B2 | 7/2003 |
| JP | 2003-266525 A | 9/2003 |
| JP | 4313538 B2 | 9/2003 |
| JP | 3979866 B2 | 10/2003 |
| JP | 3996871 B2 | 3/2004 |
| JP | 4053837 B2 | 3/2004 |
| JP | 4127119 B2 | 3/2004 |
| JP | 4134710 B2 | 7/2004 |
| JP | 4269704 B2 | 8/2004 |
| JP | 2004-319444 A | 11/2004 |
| JP | 2005-170613 A | 6/2005 |
| JP | 2005-239940 A | 9/2005 |
| JP | 2005-340616 A | 12/2005 |
| JP | 2007-035694 A | 2/2007 |
| JP | 2007-070514 A | 3/2007 |
| JP | 2007-150084 A | 6/2007 |
| JP | 2007-204538 A | 8/2007 |
| JP | 2007-217129 A | 8/2007 |
| JP | 2008-028294 A | 2/2008 |
| JP | 2008-130642 A | 6/2008 |
| JP | 2009-158952 A | 7/2009 |
| JP | 2009-226824 A | 10/2009 |
| JP | 2010-036519 A | 2/2010 |
| WO | 2007/040039 A1 | 4/2007 |
| WO | 2007/063698 A1 | 6/2007 |

OTHER PUBLICATIONS

Extended European Search Report dated Apr. 25, 2103 in European Application 11169487.3.

* cited by examiner

*Primary Examiner* — Vivian Chen

(74) *Attorney, Agent, or Firm* — Sughrue Mion, PLLC

(57) ABSTRACT

A polyester film containing a polyester resin having an intrinsic viscosity IV of from 0.73 to 0.9 dL/g in which the polyester film has a specific heat change at 85° C. to 135° C. (ΔCp) of from 0.06 to 0.1 J/g, has an excellent weather resistance, a good planar surface state and a low thermal shrinkage.

9 Claims, No Drawings

POLYESTER FILM AND METHOD FOR PRODUCING SAME, BACKSHEET FOR SOLAR CELL, AND SOLAR CELL MODULE

CROSS-REFERENCE TO RELATED APPLICATIONS

The present application claims the benefit of priority from Japanese Patent Application No. 2010-134470, filed on Jun. 11, 2010, and Japanese Patent Application No. 2011-122235 filed on May 31, 2011, the contents of which are herein incorporated by reference in their entirety.

BACKGROUND OF THE INVENTION

1. Field of the Invention

The present invention relates to a polyester film excellent in weather resistance, having a good planar surface state and having a low thermal shrinkage, to its production method, to a backsheet for solar cells and to a solar cell module.

2. Description of the Related Art

A solar cell module generally has a structure of (sealant)/solar cell element/sealant/backsheet (hereinafter referred to as BS) as laminated in that order on glass through which incident sunlight passes. Concretely, the solar cell element is generally encapsulated with a resin (sealant) such as EVA (ethylene-vinyl acetate copolymer) or the like, to which BS is stuck. As the backsheet for the solar cell, heretofore used is a polyester film.

However, in general, when a polyester film is used as the backsheet (BS) for solar cells for a long period of time, it may readily peel from the solar cell, and when it is left in weathered environments such as outdoors for a long period of time, BS may readily peel from the sealant such as EVA.

Accordingly, BS is required to have high weather resistance. As such BS, there is known a weather-resistant polyester film of which the weather resistance has been improved (for example, see Patent Reference 1, JP-A 2008-130642). The weather-resistant polyester film has a relatively high intrinsic viscosity (IV) and has a relatively low terminal carboxyl group (terminal COOH) content (terminal COOH content: AV), and therefore has high hydrolysis resistance.

As BS having improved weather resistance, Patent Reference 1 proposes a laminate BS produced by laminating a film which is prepared by forming an easy-adhesion layer on the polyethylene terephthalate (PET) substrate surface of a gas barrier film, or that is, a transparent alumina-deposited film, followed by heat treating it to make it have a thermal shrinkage of 1.0%, a white PET and a weather-resistant PET of Toray's X10S.

In addition to peeling by weathering, when the solar cell module is left in an environment in which it is exposed to high temperatures for a long period of time (for example, on the roof in summer or in desert) and in case where it has a high thermal shrinkage, BS may peel from the sealant therein. Accordingly, BS is required not to peel from the other members of the solar cell module owing to the difference in the shrinkage between them, in addition to having excellent weather resistance.

In regard to this point, mere investigation of the thermal shrinkage of ordinary PET in a PET prepared by forming a water vapor barrier layer on an ordinary PET and given weather resistance is made in Patent Reference 1; however, nothing is investigated therein relating to the thermal shrinkage of a film prepared by imparting weather resistance to a PET film itself, as in the present invention, and in addition, nothing is disclosed therein relating to the thermal shrinkage of a bas barrier film, especially to a detailed thermal shrinkage controlling method in heat treatment in the coating and drying step to produce the film.

Some references disclose a method of modifying a weather-resistant polyester film to have a lowered thermal shrinkage. Concretely, Patent Reference 2 (JP-A 2003-211538) describes production of a polyester film having a thermal shrinkage of from 3 to 20%, and IV of 0.65 dL/g or so, by stretching a polyester film, then thermally fixing it at 190° C. and thermally relaxing it in the cross direction of the film in a tenter.

Patent Reference 3 (JP-A 2007-150084) describes production of a polyester film having a thermal shrinkage of from 0.1 to 1.0%, AV≤15 eq/ton, and IV≥0.8 dL/g, by stretching a polyester film, then thermally fixing it at 235° C., thermally relaxing it in the cross direction of the film in a tenter, and thereafter processing it for low-temperature thermal treatment at a low tension.

Patent Reference 4 (WO2007/040039) describes production of a polyester film having a thermal shrinkage of at most 2% and IV of from 0.6 to 1.2 dL/g, by stretching a polyester film, then thermally fixing it at 220° C., thermally relaxing it in the cross direction of the film in a tenter, and thereafter processing it for low-temperature thermal treatment at a low tension.

Patent Reference 5 (JP-A 8-187777) describes a method comprising solid-phase polymerization of a polyester resin having IV of from 0.5 to 0.6 dL/g to make it have IV of from 0.70 to 0.75 dL/g and thereafter melt-casting it to form a film. The patent reference further describes production of a polyester film having AV≤25 eq/ton by stretching the formed polyester film and then relaxing the tension thereof along with high-temperature heat treatment at 240° C. (from Tm −80 to Tm −20° C.).

On the other hand, with the recent popularization of solar cell modules, stable operation thereof has become desired in various installation sites and in various installation methods. Accordingly, BS of solar cell modules is desired not to have surface planarity defects such as curling or waving and is desired to have excellent surface planarity.

Given the situation, the present inventors investigated the methods described in Patent References 1 to 5, and have known that, though the thermal shrinkage of the polyester films described in these patent references could be improved in some degree owing to the treatment for thermal treatment reduction, but the weather resistance and the surface planarity of the films are still unsatisfactory.

For example, in the methods described in Patent References 2 to 5 where the thermal fixation temperature after stretching is lowered to reduce the thermal shrinkage of the formed films, it may be predicted that, owing to the advanced molecular alignment (tension) inside the film, water could hardly penetrate between the molecules and therefore the hydrolyzability of the film may lower and the weather resistance thereof could be thereby enhanced. In the films obtained according to the method of lowering the thermal fixation temperature after stretching, the molecular alignment may be broken when heated, and therefore the thermal shrinkage of the films may increase. To solve this problem, it may be predicted that the methods in Patent References 2 to 4 comprise thermal relaxation treatment. However, the present inventors' investigation has revealed that the thermal relaxation treatment merely reduces and controls the molecular alignment inside the film, but the weather resistance and the thermal shrinkage are in a trade-off relation therebetween, and therefore it is impossible to attain both weather resistance enhancement and thermal shrinkage reduction on a high level. In the methods described in Patent References 2 to 5, the draw ratio is increased in some degree for enhancing the weather resistance of the formed films, thereby providing high-orientation polyester films. Accordingly, the stretched film has a high thermal shrinkage, and is therefore greatly shrunk during thermal relaxation treatment. As a result, it has been known that the obtained films deform like corrugated sheets and their surface planarity is poor.

On the other hand, Patent Reference 1 uses ordinary PET. PET itself has poor weather resistance and, in addition, as a result of the present inventors' investigation, it has been known that reduction in the thermal shrinkage of PET is unsatisfactory and the surface planarity thereof is poor.

Accordingly, BS heretofore known in the art is in fact unsatisfactory in that it could not satisfy both the improvement in the surface planarity and the weather resistance thereof and the reduction in the thermal shrinkage thereof.

SUMMARY OF THE INVENTION

The present invention has been made in consideration of the above-mentioned situation, and its object is to provide a polyester film excellent in weather resistance, having a good planar surface state and having a low thermal shrinkage, and its production method, and to provide a backsheet for solar cells and a solar cell module having long-term durability.

To attain the above object, the present inventors have assiduously studied and have found that, when a polyester resin having an intrinsic viscosity higher than ever before is used and when the resin film is, after stretched, thermally fixed under local temperature unevenness, then surprisingly, a polyester film improved both in point of enhancing the surface planarity and the weather resistance thereof and in point of reducing the thermal shrinkage thereof can be obtained. The inventors have specifically noted the physical properties of the polyester film produced according to the method, and have known that not only the intrinsic viscosity (IV) of the formed polyester resin film falls within a specific range but also the internal structure thereof differs from that of the resin. Concretely, the inventors have known that the obtained polyester film has an increased proportion of the amorphous fragment of the polyester resin. The inventors have specifically noted the amorphous fragment of the polyester resin, and have known that the amorphous fragment includes an ordinary amorphous fragment that starts the movement at Tg (glass transition temperature) and an amorphous fragment of which the transition point is higher than Tg and which has poor mobility (hereinafter this is referred to as "low-mobility fragment"). Given that situation, the inventors have assiduously studied the amount of the low-mobility fragment, and have found that, when the amount of the low-mobility fragment falls within a specific range, then the film can more readily attain both enhancing the weather resistance thereof and reducing the thermal shrinkage thereof. On the other hand, the inventors have further found that the amount of the low-mobility fragment of the polyester resin corresponds to the specific heat change of the resin at a temperature of from 85 to 135° C. (hereinafter this is referred to as $\Delta Cp$). However, merely when $\Delta Cp$ is controlled to fall within the range, the thermal shrinkage and the surface planarity, especially the surface planarity of the film is still unsatisfactory. Based on the above findings, the inventors have tried further restricting the production condition so that $\Delta Cp$ and IV each could fall within the above range and have determined and evaluated the weather resistance, the thermal shrinkage and the surface condition of the obtained films, and as a result, have found out the specific range capable of satisfying the requirement of improving the weather resistance and the surface planarity and the requirement of reducing the thermal shrinkage, and have completed the present invention.

The polyester film of which both $\Delta Cp$ and IV are controlled each to fall the specific range could not be produced according to conventional methods, especially through thermal fixation, thermal relaxation or heat treatment either singly or as combined after stretching, as described in Patent References 1 to 5. Specifically, in the polyester films produced according to conventional production methods, theoretically, the weather resistance and the thermal shrinkage of the film are simultaneously controlled by the intensity of the alignment of the polyester resin, and therefore, inevitably, the improvement in weather resistance and the reduction in thermal shrinkage of the film are in a relation of trade-off therebetween. As opposed to this, in the present invention, the production method itself is significantly modified to produce a polyester film of which the internal structure greatly differs from before, and as a result, the polyester film of the invention capable of solving the above problems is hereby produced.

Specifically, the invention provides concrete means for solving the above problems, as follow:

[1] A polyester film comprising a polyester resin wherein:

the polyester film has a specific heat change at 85° C. to 135° C. ($\Delta Cp$) of from 0.06 to 0.1 J/g, and the polyester resin has an intrinsic viscosity IV of from 0.73 to 0.9 dL/g.

[2] The polyester film of [1], wherein the polyester resin has a terminal carboxyl group content AV of from 5 to 21 eq/ton.

[3] The polyester film of [1] or [2], having a thermal shrinkage of from 0.05 to 0.5%.

[4] The polyester film of any one of [1] to [3], wherein the heat treatment time for which the polyester film is heat-treated at 120° C. and at a relative humidity of 100% and maintains 50% retention of elongation at break after the heat treatment is from 75 hours to 150 hours.

[5] The polyester film of any one of [1] to [4], having a haze of from 0.1 to 40%.

[6] The polyester film of any one of [1] to [5], comprising a trifunctional or more polyfunctional constitutive ingredient (a tri- or more functional constitutive ingredient), in which the total of the carboxyl acid groups and the hydroxyl groups in one molecule is at least 3, in an amount of from 0.005 mol % to 2.5 mol % of the polyester film.

[7] The polyester film of any one of [1] to [6], containing at least one terminal blocking agent of isocyanate compounds, carbodiimide compounds and epoxy compounds, in an amount of from 0.1% by mass to 5% by mass of the polyester film.

[8] A method for producing a polyester film, which comprises:

forming a polyester film through melt extrusion of a polyester resin having an intrinsic viscosity IV of from 0.74 to 0.91 dL/g, stretching the polyester film, and thermally fixing the stretched polyester film wherein the film is given a local temperature fluctuation of from 0.1 to 10° C. in the film width direction.

[9] The method for producing a polyester film of [8], wherein in the thermal fixation step, the film is given a local temperature fluctuation of from 0.5 to 4° C. in the film width direction.

[10] A method for producing a polyester film, which comprises:

forming a polyester film through melt extrusion of a polyester resin having an intrinsic viscosity IV of from 0.74 to 0.91 dL/g, stretching the polyester film, and thermally fixing the stretched polyester film wherein the film is given a wind speed fluctuation of from 0.1 to 10% in the film width direction.

[11] The method for producing a polyester film of any one of [8] to [10], which comprises heat-treating a polyester resin at 190° C. to 230° C. for 10 to 80 hours to thereby prepare the polyester resin to be fed to melt extrusion film formation.

[12] The method for producing a polyester film of any one of [8] to [11], wherein the lateral draw ratio/longitudinal draw ratio in stretching is from 1.03 to 1.3 times and the areal draw ratio is from 11 to 18 times.

[13] The method for producing a polyester film of any one of [8] to [12], wherein the thickness of the polyester film after stretching is from 30 to 500 μm.

[14] The method for producing a polyester film of anyone of [8] to [13], wherein the thermal fixation is conducted at a temperature of from 195 to 230° C.

[15] The method for producing a polyester film of anyone of [8] to [14], which comprises esterification with a Ti-based catalyst to prepare the polyester resin to be fed to melt extrusion film formation.

[16] The method for producing a polyester film of anyone of [8] to [15], which comprises heat treatment at 100 to 200° C. for 0.5 to 10 minutes after the thermal fixation.

[17] The method for producing a polyester film of [16], which comprises forming a coating layer on the polyester film and drying the coating layer in a drying zone after the thermal fixation wherein the heat treatment is attained in the drying zone.

[18] The method for producing a polyester film of [16] or [17], wherein the heat treatment is on-line attained after the stretching.

[19] A polyester film produced according to the polyester film production method of any one of [8] to [18].

[20] A backsheet for solar cells, comprising the polyester film of any one of [1] to [7] and [19].

[21] A solar cell module, comprising the polyester film of any one of [1] to [7] and [19].

According to the invention, there are provided a polyester film excellent in weather resistance, having a good planar surface state and having a low thermal shrinkage, its production method, and a backsheet for solar cells and a solar cell module having excellent long-term durability.

DETAILED DESCRIPTION OF THE INVENTION

The polyester film and its production method of the invention, and the backsheet for solar cells and the solar cell module of the invention using the film are described in detail hereinunder.

The description of the constitutive elements of the invention given hereinunder is for some typical embodiments of the invention, to which, however, the invention should not be limited. In this description, the numerical range expressed by the wording "a number to another number" means the range that falls between the former number indicating the lowermost limit of the range and the latter number indicating the uppermost limit thereof.

[Polyester Film]

The polyester film of the invention (hereinafter this may be referred to as the film of the invention) contains a polyester resin and has a specific heat change at 85° C. to 135° C. ($\Delta Cp$) of from 0.06 to 0.1 J/g, wherein the intrinsic viscosity IV of the polyester resin is from 0.73 to 0.9 dL/g.

The polyester film of the invention is described below.

(Specific Heat Change $\Delta Cp$)

The polyester film of the invention contains a polyester resin and has a specific heat change at 85° C. to 135° C. ($\Delta Cp$) of from 0.06 to 0.1 J/g. $\Delta Cp$ is a parameter corresponding to the amount of the fragment that starts to move at the transition point thereof appearing from Tg+5° C. to Tg+50° C. Tg means the glass transition temperature of the resin. Concretely, $\Delta Cp$ is a parameter corresponding to the abundance of the low-amorphous fragment (low-mobility fragment) having a higher transition point than the temperature (Tg) at which an ordinary amorphous fragment starts to move and having a low motility, in the polyester film of the invention. The low-mobility fragment has a low mobility in the polyester film and is expected to hardly shrink even when exposed to heat. On the other hand, it is considered that the low-mobility molecules that constitute the low-mobility fragment would be bound at both ends thereof, and it is predicted that the intermolecular free volume of the molecules would be small and water would hardly penetrate thereinto.

Not adhering to any theory, in case where $\Delta Cp$ is not lower than the lowermost limit of the range defined in the invention owing to these two effects, the thermal shrinkage may be reduced not lowering the weather resistance (especially corresponding to hydrolysis resistance), and therefore the weather resistance of the film could be sufficient and the thermal shrinkage of the film could be reduced. In case where $\Delta Cp$ is not higher than the uppermost limit of the range defined in the invention, the intermolecular tension caused by the amount of the low-mobility fragment would not increase too much and there does not occur residual strain caused by it, and therefore the surface planarity of the film could be sufficiently good. When $\Delta Cp$ is not higher than the uppermost limit of the range defined in the invention, then the weather resistance change before and after thermal shrinkage treatment could be reduced.

$\Delta Cp$ is preferably from 0.065 J/g to 0.095 J/g, more preferably from 0.07 J/g to 0.09 J/g.

(Intrinsic Viscosity IV)

Of the polyester resin that constituted the polyester film of the invention, the intrinsic viscosity (IV, this may be referred to as a limiting viscosity, and is approximately proportional to the molecular weight of the polyester resin) is from 0.73 to 0.9 dL/g. Specifically, IV is preferably smaller than before. The present inventors have found that, in the invention, in case where $\Delta Cp$ corresponding to the amount of the low-mobility fragment in the polyester film is merely controlled to fall within the range defined in the invention, the thermal shrinkage and the surface planarity, especially the surface planarity of the film is still unsatisfactory, and when the intrinsic viscosity of the polyester film is additionally controlled to fall within the range defined in the invention, then the unsatisfaction can be overcome. Not adhering to any theory, when the value of IV falls within the range defined in the invention, the mobility of the constitutive molecules can be lowered and therefore the thermal shrinkage of the film can be reduced and the surface planarity thereof can be improved, and further, the weather resistance of the film can also be improved.

The low-mobility fragment can be formed when the constitutive molecules are crosslinked between crystals. In case where the resin has many molecular terminals (that is, when IV of the resin is low), the constitutive molecules are hardly crosslinked and the amount of the low-mobility fragment is thereby reduced. On the other hand, when IV is more than the range defined in the invention (that is, the resin has an increased molecular weight), then the mobility of the molecules may lower and therefore could hardly be caught in crystals and the amount of the low-mobility fragment is thereby reduced. Accordingly, from the viewpoint of controlling the value ΔCp to fall within the range defined in the invention, it is desirable that IV is controlled to fall within the range defined in the invention.

Further, defining the value IV to fall within the scope of the invention brings about another effect of preventing break (peeling) in the interface between the film and the adherend (especially the sealant (e.g., EVA) provided on the cell-side substrate of a solar cell module) caused by embrittlement to occur through molecular weight reduction.

The value IV is preferably from 0.75 to 0.88 dL/g, more preferably from 0.77 to 0.85 dL/g.

The intrinsic viscosity (IV) is a value computed by extrapolating the value obtained by dividing the specific viscosity, which is computed by subtracting 1 from the ratio of the solution viscosity ($\eta$) to the solvent viscosity ($\eta_0$), $\eta_r (=\eta/\eta_0$; relative viscosity), $\eta_{sp}=\eta_r-1$), to a state where the concentration is zero. IV is obtained from the solution viscosity in a mixed solvent of 1,1,2,2-tetrachloroethane/phenol (=⅔ by mass) at 30° C.

(Terminal Carboxyl Group Content, AV)

In the polyester film of the invention, preferably, the terminal carboxyl group (terminal COOH) content (terminal COOH content: AV) of the polyester resin is from 5 eq/ton to 21 eq/ton. The terminal carboxylic acid has strong interaction between the polyester resin molecules, and therefore high AV promotes aggregation of polyester resin molecules. In the invention, preferably, AV of the polyester resin is relatively small. Not adhering to any theory, it is predicted that the low-mobility fragment could be formed through crosslinking of polyester resin molecules between crystals. When AV is not larger than the uppermost limit of the above-mentioned preferred range, then the number of the —COOH groups that are more bulky (as compared with the other terminal —OH group of the polyester resin molecule) would reduce and therefore the polyester resin molecules could be more readily caught by the polyester resin crystals, and accordingly, the amount of the low-mobility fragment, or that is, ΔCp of the film can be thereby increased. On the other hand, when AV is not smaller than the lowermost limit of the preferred range, then there could exist the bulky terminal COOH in some degree in the resin, and therefore the intermolecular space would not be too small and the molecules can readily move. As a result, the mobility of the molecules may increase and the molecules may be readily caught by crystals, and accordingly, the amount of the low-mobility fragment, or that is, ΔCp of the film can be thereby increased.

The other effects of the invention than the effect of regulating ΔCp to be attained by controlling AV to fall within the above range than are the effect of controlling hydrolysis to thereby enhance the weather resistance of the film, and the effect of reducing the adhesion of contaminants to the surface of the film since the COOH group in the film surface can be reduced and since the contaminants would be caused by the polar group.

The terminal COOH content is more preferably from 6 eq/ton to 20 eq/ton, even more preferably from 7 eq/ton to 19 eq/ton.

The terminal COOH content may be determined as follows: The polyester is completely dissolved in a mixed solution of benzyl alcohol/chloroform (=⅔ by volume), and using phenol red as an indicator, the resulting solution is titered with a standard solution (0.025 N KOH/methanol mixed solution), and the terminal COOH content is computed from the data of titration.

Preferably, the polyester film of the invention has 5≤AV≤21 eq/ton and 0.73≤IV≤0.9, more preferably 6 eq/ton≤AV≤20 eq/ton and 0.75≤IV≤0.88, even more preferably 7 eq/ton≤AV≤19 eq/ton and 0.77≤IV≤0.85.

(Thermal Shrinkage)

Preferably, the polyester film of the invention has a thermal shrinkage of from 0.05 to 0.5%.

Thermal treatment in the preferred embodiment of the production method for the polyester film of the invention to be mentioned hereinunder may further reduce the thermal shrinkage. The preferred thermal shrinkage is from 0.05% to 0.5%, more preferably from 0.1 to 0.45%, even more preferably from 0.15% to 0.4%. The thermal shrinkage as referred to herein is meant to indicate the mean value of the found data in MD (machine direction, or that is, film traveling direction) and those in TD (transverse direction, or that is the direction perpendicular to the film traveling direction) of the film heated at 150° C. for 30 minutes.

When the thermal shrinkage is not higher than the uppermost limit of the above-mentioned preferred range, then the polyester film of the invention hardly shrinks and wrinkles in the heat treatment in the preferred embodiment of the production method for the film to be mentioned below, and therefore the surface planarity of the produced polyester film itself could be bettered. On the other hand, when the thermal shrinkage is not lower than the lowermost limit of the preferred range, it is favorable since the film hardly wrinkles owing to the dimensional change (sagging) caused by thermal expansion during heat treatment.

(Weatherability Time)

The polyester film of the invention is preferably such that the heat treatment time for which the film is heat-treated at 120° C. and at a relative humidity of 100% and secures at least 50% retention of elongation at break after the heat treatment (hereinafter this is referred to as "weatherability time" and means the weathering resistance-retaining time) is at least 75 hours.

When the polyester film of the invention is controlled to have ΔCp and IV each falling within the range defined as above, then its weather resistance is enhanced and its weatherability time can be at least 75 hours. Preferably, the weatherability time is from 75 to 150 hours, more preferably from 80 hours to 140 hours, even more preferably from 85 hours to 135 hours. When the weatherability time is not shorter than the lowermost limit of the above range, then the antiaging property of the film in outdoor use in solar cells is good. A polyester film having a weatherability time of shorter than 150 hours could be produced even when ΔCp thereof is not over the uppermost limit of the range defined in the invention, however, when ΔCp is controlled to be not higher than the uppermost limit of the range, then the surface planarity of the produced film can be bettered, and therefore the weatherability time is preferably not longer than 150 hours.

The hydrolysis resistance can be evaluated according to the above-mentioned weatherability time. Briefly, the film is forcedly heat-treated at 120° C. and at a relative humidity of 100% (this is hereinafter referred to as thermotreatment) to thereby promote the hydrolysis thereof, and the hydrolysis resistance of the film is derived from the reduction in the elongation at break of the film. The concrete method for the measurement is described below.

In the invention, the weatherability time is the heat treatment time [hr] for which at least 50% retention of elongation at break is kept after heat treatment at 120° C. and at a relative humidity of 100% (thermotreatment). The retention of elongation at break is computed according to the following formula (i):

$$\text{Retention of Elongation at Break [\%]} = (\text{elongation at break after thermotreatment})/(\text{elongation at break before thermotreatment}) \times 100 \quad (1)$$

Concretely, a sample of the polyester film is heat-treated at 120° C. and at a relative humidity of 100% for hours to 300 hours at intervals of 10 hours (for thermotreatment), and then the elongation at break of the thermotreated sample is measured. The measured value is divided by the elongation at break of the film before the thermotreatment to give the retention of elongation at break of the film at each thermotreatment time. The data are plotted on a graph in which the horizontal axis indicates the thermotreatment time and the vertical axis indicates the retention of elongation at break, and in which the heat treatment time to give at least 50% retention of elongation at break is read on the curve of the plotted data.

The elongation at break is determined as follows: A sample of the polyester film is set on a tensile tester, and pulled at 20 mm/min in an environment at 25° C. and at a relative humidity of 60%. The elongation of the sample before break is measured both in MD and TD, in 10 different points taken at intervals of 20 cm. One sample is measured repeatedly five times at every point, thereby giving data of 50 points in all. All the data are averaged to give the elongation at break of the film.

(Haze)

Preferably, the polyester film of the invention has a haze of from 0.1% to 40%, more preferably from 0.2% to 30%, even more preferably from 0.3% to 20%.

The haze of the film may be increased by adding fine particles thereto or by forming voids therein. When the haze is not higher than the uppermost limit of the preferred range, then the fine particles and the voids in the film are not too large, and therefore during the production thereof, the film is not unevenly stretched around the fine particles and the voids. Specifically, the polyester resin in the film hardly has a high-orientation part and a low-orientation part. The high-orientation part has extremely strong residual strain, and this shrinks during relaxation heat treatment. On the other hand, the low-orientation part readily forms a low-mobility fragment, and its weather resistance is low. Of the polyester film of the invention, the haze is controlled to be not higher than the uppermost limit of the above-mentioned preferred range, and therefore, the thermal shrinkage of the film during thermal relaxation treatment after stretching in its production can be reduced, and the weather resistance of the obtained film is prevented from lowering and the surface planarity thereof is prevented from worsening.

On the other hand, the haze of the polyester film of the invention is preferably not lower than the lowermost limit of the preferred range from the viewpoint of not lowering the weather resistance of the film during thermal relaxation treatment thereof. The haze of the film may increase owing to the crystals therein, however, when the haze of film is not lower than the lowermost limit of the preferred range, then the amount of the crystals in the polyester resin may not be too low and the amount of the low-mobility fragment that extends over the crystals may increase, and therefore, ΔCp of the film can be readily controlled to fall within the range defined in the invention.

(Thickness)

Preferably, the thickness of the film is from 30 µm to 500 µm, more preferably from 40 µm to 400 µm, even more preferably from 45 µm to 360 µm.

In case where the polyester film of the invention is used alone as the backsheet for solar cells, not laminated with any other resin film, the polyester film is preferably thicker. In such a case, the thickness of the film is preferably from 30 to 500 µm, more preferably from 40 to 400 µm, even more preferably from 45 to 360 µm.

Increasing the thickness of the polyester film of the invention is preferred; however, increasing the thickness thereof generally results in the increase in the water content of the film, therefore directly lowers the hydrolysis resistance of the film. Accordingly, when conventional known polyester films are merely thickened, their hydrolysis resistance lower and the films could hardly have long-term durability. As opposed to this, the polyester film of the invention satisfies the above-mentioned ΔCp and IV, and therefore even when thickened, the film secures a weatherability time (time for retention of elongation at break) of at least 75 hours.

(Surface Condition)

The polyester film of the invention has a good surface condition, or that is, has excellent surface planarity. Accordingly, the film can be used even in the sites or the environments where conventional solar cell modules could not be installed. Conventional weather-resistant polyester films are readily deformed like corrugated sheets. The surface condition of the film can be evaluated by visually counting the number of the waves of the corrugated surface thereof. Controlling the thickness of the polyester film of the invention to fall within the above-mentioned preferred range makes it possible to prevent the thermally-fixed film from having a risk of surface curving (hereinafter this may be referred to uneven stretching of film) and thereby makes to improve the surface condition of the film.

(Layer Constitution)

The polyester film of the invention may be a single-layer film.

The film of the invention may be a laminate having any other layers. In this case, the laminate may comprise, in addition to the polyester film satisfying ΔCp and IV each to fall within the range defined in the invention, any other polyester film and any other resin film.

Above all, the film of the invention preferably contains, as the polyester film therein, only one polyester film satisfying ΔCp and IV each to fall within the range defined in the invention.

On the other hand, preferably, the film of the invention having a thickness of from 30 µm to 200 µm is laminated with any other film for securing the necessary withstand voltage in use as solar cell backsheets, thereby having a thickness of from 100 µm to 500 µm. The other film to be stuck to the film of the invention is preferably a fluororesin film, a polyester film, an Si resin film, a polyolefin film or a polyvinyl alcohol film.

The film of the invention may additionally have various functional layers in addition to the resin layer such as the polyester resin layer therein. The functional layers will be described in the section of the backsheet for solar cells of the invention to be given hereinunder. Above all, preferred is an embodiment where at least one of an easy adhesion layer and a colorant layer (preferably, a white layer (reflection layer)) is laminated on the polyester film of the invention; more preferred is an embodiment where both an easy adhesion layer and a white layer (reflection layer) are laminated on both surfaces of the polyester film; and even more preferred is an embodiment where both an easy adhesion layer and a white layer (reflection layer) are laminated on both surfaces of the polyester film by coating the surfaces thereof.

(Other Properties, Additives)

Preferably, the absorbance at 380 nm of the polyester film of the invention is from 0.001 to 0.1. When the absorbance falls within the range and when the polyester film is used as a backsheet for solar cells, the film is prevented from being photolyzed to produce terminal COOH and to promote the hydrolysis thereof. The absorbance is more preferably from 0.01 to 0.09, even more preferably from 0.02 to 0.08.

The absorbance may be controlled by adding an organic or inorganic UV absorbent to the film; and from the viewpoint of securing the long-term durability of the film, preferably, an inorganic UV absorbent is added to the film. The UV absorbent may be the same as those mentioned in the section of additives to be given below. Above all, $TiO_2$ is more preferred as the UV absorbent. Preferably, the amount of the UV absorbent to be added is from 0.01% by mass to 5% by mass of the polyester, more preferably from 0.1% by mass to 3% by mass, even more preferably from 0.3% by mass to 3% by mass.

The absorbance may be measured as follows: A sample of the polyester film having a thickness of 300 μm is stuck to the sample side of a spectrophotometer, and air is on the reference side, and the absorbance of the sample is measured at a wavelength of 380 nm.

Preferably, the polyester film of the invention is produced, using a titanium compound as a catalyst. The amount to be used of the titanium compound may be smaller than that of the other catalyst (Sb, Ge, Al) than titanium compounds, and therefore the titanium catalyst can prevent the formation of spherocrystals from the nuclei of the catalyst. The details of the titanium compounds are described in the section of the polyester film production method to be given below.

In case where the polyester film is produced by the use of a titanium compound, the film preferably contains a titanium atom in a range of from 1 ppm to 30 ppm.

The polyester film of the invention may further contain other additives such as a light stabilizer and an antioxidant.

Preferably, the polyester film of the invention contains a light stabilizer. Containing a light stabilizer, the film is prevented from being degraded by UV rays. The light stabilizer includes compounds capable of absorbing light rays such as UV rays to convert them into heat energy, and materials capable of trapping the radicals generated through light absorption and decomposition of films and inhibiting decomposition chain reaction.

The light stabilizer is preferably a compound capable of absorbing light rays such as UV rays to convert them into heat energy. In case where the film contains the light stabilizer of the type and even when the film is exposed to UV rays continuously for a long period of time, the partial discharge voltage-increasing effect of the film can be kept high for a long period of time, and therefore the film can be protected from UV rays to cause discoloration and strength reduction. Within the range not detracting from the other properties of the polyester film, any of organic UV absorbents and inorganic UV absorbents may be used in the film either singly or as combined with no specific limitation thereon. Preferably, the UV absorbent is excellent in wet heat resistance and can be uniformly dispersed in the film.

Examples of organic UV absorbents usable here are salicylic acid-type, benzophenone-type, benzotriazole-type and cyanoacrylate-type UV absorbents, and hindered amine-type UV stabilizers. Concretely, there are mentioned salicylic acid-type UV absorbents such as p-t-butylphenyl salicylate, p-octylphenyl salicylate; benzophenone-type UV absorbents such as 2,4-dihydroxybenzophenone, 2-hydroxy-4-methoxybenzophenone, 2-hydroxy-4-methoxy-5-sulfobenzophenone, 2,2',4,4'-tetrahydroxybenzophenone, bis(2-methoxy-4-hydroxy-5-benzoylphenyl)methane; benzotriazole-type UV absorbents such as 2-(2'-hydroxy-5'-methylphenyl)benzotriazole, 2-(2'-hydroxy-5'-methylphenyl)benzotriazole, 2,2'-methylenebis[4-(1,1,3,3-tetramethylbutyl)-6-(2H-benzot riazol-2-yl)phenol]; cyanoacrylate-type UV absorbents such as ethyl 2-cyano-3,3'-diphenylacrylate; triazine-type UV absorbents such as 2-(4,6-diphenyl-1,3,5-triazin-2-yl)-5-[(hexyl)oxy]phenol; hindered amine-type UV stabilizers such as bis(2,2,6,6-tetramethyl-4-piperidyl)sebacate, dimethyl succinate/1-(2-hydroxyethyl)-4-hydroxy-2,2,6,6-tetramethylpiperidine polycondensate; and nickelbis(octylphenyl)sulfide, and 2,4-di-t-butylphenyl 3',5'-di-tert-butyl-4'-hydroxybenzoate.

Of those UV absorbents, more preferred are triazine-type UV absorbents as highly resistant to repeated UV absorption. These UV absorbents may be added to the film alone or in the form of a copolymer prepared by copolymerizing a UV-absorbent monomer with an organic conductive material or a water-insoluble resin.

The content of the light stabilizer in the polyester film is preferably from 0.1% by mass to 10% by mass relative to the total mass of the polyester film, more preferably from 0.3% by mass to 7% by mass, even more preferably from 0.7% by mass to 4% by mass. Accordingly, in the film of the invention, the molecular weight of the polyester may be prevented from being lowered owing to optical degradation in long term aging, and the adhesiveness of the film may be thereby prevented from being lowered owing to the cohesion failure to occur in the film.

Further, the polyester film of the invention may contain additives such as lubricant (fine particles), colorant, thermal stabilizer, nucleating agent (crystallizing agent), flame retardant.

[Polyester Film Production Method]

The polyester film of the invention may be produced according to the following two polyester film production methods of the invention (hereinafter referred to as "production methods of the invention").

The first polyester film production method of the invention comprises a step of forming a polyester film through melt extrusion of a polyester resin having an intrinsic viscosity IV of from 0.74 to 0.91 dL/g, a step of stretching the polyester film, and a step of thermally fixing the stretched polyester film, in which, in the thermal fixation step, the film is given a local temperature fluctuation of from 0.1 to 10° C. in the film width direction.

The second polyester film production method of the invention comprises a step of forming a polyester film through melt extrusion of a polyester resin having an intrinsic viscosity IV of from 0.74 to 0.91 dL/g, a step of stretching the polyester film, and a step of thermally fixing the stretched polyester film, in which, in the thermal fixation step, the film is given a wind speed fluctuation of from 0.1 to 10% in the film width direction.

The first and second polyester film production methods of the invention are described below.

(Preparation of Starting Polyester Resin)

In the polyester film production method of the invention, a polyester resin having an intrinsic viscosity IV of from 0.74 to 0.91 dL/g is formed into a film through melt extrusion.

Using the polyester resin of which IV falls within the above range as the starting material gives a film of good stretchability, and the formed film is free from stretching unevenness. In the production method of the invention, IV of the polyester resin reduces slightly (for example, by from 0.01 to 0.04 dL/g or so), and therefore, since the polyester resin of which IV falls within the range is used as the starting material resin, the formed film may have the controlled IV of from 0.73 to 0.9 dL/g that is desired for the polyester film of the invention. In Examples in JP-A 2010-248492, IV of the starting polyester resin material greatly lowers when formed into a film. The reason why IV of the polyester resin reduces little in the production method of the invention may be because the method includes a step of solid-phase polymerization under the atmosphere of ethylene glycol and a step of melt casting film formation using double-screw kneading apparatus, and therefore, the above-mentioned polyester film production method is preferred.

The polyester resin for use in the invention, of which IV falls in the above range, can be prepared by synthesis or polymerization or is available on the market.

For controlling IV to fall within the range, the polymerization time in liquid-phase polymerization of the resin may be controlled and/or the resin may be prepared through solid-phase polymerization.

For controlling AV to fall within the above-mentioned range, the vacuum degree in polymerization may be increased and the oxidation of the polymer by residual oxygen may be prevented. Solid-phase polymerization is also preferred.

Preferably, the polyester film production method of the invention includes an esterification step of esterification and/or transesterification for producing the polyester resin having an intrinsic viscosity IV of from 0.74 to 0.91 dL/g.

—Esterification Step—

The production method of the invention may include an esterification step of producing a polyester through esterification and polycondensation. The esterification step comprises (a) esterification and (b) polycondensation of the esterified product.

(a) Esterification:

The polyester to form the polyester film of the invention may be prepared through esterification and/or transesterification in a known manner of (A) a dicarboxylic acid or its ester derivative of, for example, aliphatic dicarboxylic acids such as malonic acid, succinic acid, glutaric acid, adipic acid, suberic acid, sebacic acid, dodecanedioic acid, dimeric acid, eicosanedioic acid, pimelic acid, azelaic acid, methylmalonic acid, ethylmalonic acid; alicyclic dicarboxylic acids such as adamantane-dicarboxylic acid, norbornene-dicarboxylic acid, isosorbide, cyclohexanedicarboxylic acid, decalindicarboxylic acid; aromatic dicarboxylic acids such as terephthalic acid, isophthalic acid, phthalic acid, 1,4-naphthalenedicarboxylic acid, 1,5-naphthalenedicarboxylic acid, 2,6-naphthalenedicarboxylic acid, 1,8-naphthalenedicarboxylic acid, 4,4'-diphenyldicarboxylic acid, 4,4'-diphenylether-dicarboxylic acid, 5-sodium-sulfoisophthalic acid, phenylindanedicarboxylic acid, anthracenedicarboxylic acid, phenanthrene-dicarboxylic acid, 9,9'-bis(4-carboxyphenyl)fluorenic acid, and (B) a diol compound of, for example, aliphatic diols such as ethylene glycol, 1,2-propanediol, 1,3-propanediol, 1,4-butanediol, 1,2-butanediol, 1,3-butanediol; alicyclic diols such as cyclohexanediemthanol, spiroglycol, isosorbide; aromatic diols such as bisphenol A, 1,3-benzenedimethanol, 1,4-benzenedimethanol, 9,9'-bis(4-hydroxyphenyl)fluorene.

Preferably, at least one aromatic dicarboxylic acid is used as the dicarboxylic acid component. More preferably, the dicarboxylic acid component contains an aromatic dicarboxylic acid as the main ingredient thereof. "Main ingredient" as referred to herein means that the proportion of the aromatic dicarboxylic acid is at least 80% by mass of the dicarboxylic acid component. The dicarboxylic acid component may contain any other dicarboxylic acid than aromatic dicarboxylic acid. The other dicarboxylic acid includes ester derivatives of aromatic dicarboxylic acids.

Use of at least one aliphatic diol as the diol component is preferred. The aliphatic diol may contain ethylene glycol, and the diol component preferably contains ethylene glycol as the main ingredient thereof. "Main ingredient" means that the proportion of ethylene glycol is at least 80% by mass of the diol component.

The amount to be used of the aliphatic diol (e.g., ethylene glycol) is preferably within a range of from 1.015 to 1.50 mols per mol of the aromatic dicarboxylic acid (e.g., terephthalic acid) and optionally its ester derivative. The amount is more preferably from 1.02 to 1.30 mols, even more preferably from 1.025 to 1.10 mol. When the amount is not less than 1.015 mols, then the esterification goes on well; and when not more than 1.50 mols, for example, side production of diethylene glycol owing to dimerization of ethylene glycol may be prevented, and the polyester produced may be good in point of the melting point, the glass transition temperature, the crystallinity, the heat resistance, the hydrolysis resistance and the weather resistance.

Above all, more preferred polyesters are polyethylene terephthalate (PET), polyethylene 2,6-naphthalate (PEN); and even more preferred is PET.

Preferably, PET contains terephthalic acid and ethylene glycol in an amount of at least 90 mol %, more preferably at least 95 mol %, even more preferably at least 98 mol %.

Preferably, the polyester film of the invention contains a trifunctional or more polyfunctional constitutive ingredient, in which the total of the carboxyl acid groups and the hydroxyl groups in one molecule is at least 3 (hereinafter this may be referred to as "trifunctional or more polyfunctional constitutive ingredient), or at least one terminal blocking agent of isocyanate compounds, carbodiimide compounds and epoxy compounds. Accordingly, the polyester film production method of the invention preferably includes a step of adding a trifunctional or more polyfunctional constitutive ingredient, in which the total of the carboxyl acid groups and the hydroxyl groups in one molecule is at least 3, or at least one terminal blocking agent of isocyanate compounds, carbodiimide compounds and epoxy compounds. These "trifunctional or more polyfunctional constitutive ingredient" and "terminal blocking agent" may be used here either singly or as combined.

Preferably, the polyester film of the invention contains "a trifunctional or more polyfunctional constitutive ingredient", or that is, a constitutive ingredient in which the total of the carboxyl acid groups (a) and the hydroxyl groups (b), (a+b) is at least 3. In the constitutive ingredient in which the total of the carboxyl acid groups (a) and the hydroxyl groups (b), (a+b) is at least 3 (trifunctional or more polyfunctional constitutive ingredient, p), the carboxylic acid constitutive ingredient in which the number of the carboxyl acid groups (a) is at least 3 includes, as a trifunctional aromatic carboxylic acid constitutive ingredient, trimesic acid, trimellitic acid, pyromellitic acid, naphthalenetricarboxylic acid, anthracenetricarboxylic acid, etc.; as a trifunctional aliphatic carboxylic acid constitutive ingredient, methanetricarboxylic acid, ethanetricarboxylic acid, propanetricarboxylic acid, butanetricarboxylic acid, etc.; as a tetrafunctional aromatic carboxylic acid constitutive ingredient, benzenetetracarboxylic acid, benzophenonetetracarboxylic acid, naphthalenetetracarboxylic acid, anthracenetetracarboxylic acid, perylenetetracarboxylic acid, etc.; as a tetrafunctional aliphatic carboxylic acid constitutive ingredient, ethanetetracarboxylic acid, ethylenetetracarboxylic acid, butanetetracarboxylic acid, cyclopentanetetracarboxylic acid, cyclohexanetetracarboxylic acid, adamantanetetracarboxylic acid, etc.; as a pentafunctional or more polyfunctional aromatic carboxylic acid constitutive ingredient, benzenepentacarboxylic acid, benzenehexacarboxylic acid, naphthalenepentacarboxylic acid, naphthalenehexacarboxylic acid, naphthaleneheptacarboxylic acid, naphthaleneoctacarboxylic acid, anthracenepentacarboxylic acid, anthracenehexacarboxylic acid, anthraceneheptacarboxylic acid, anthraceneoctacarboxylic acid, etc.; as a pentafunctional or more polyfunctional aliphatic carboxylic acid constitutive ingredient, ethanepentacarboxylic acid, ethaneheptacarboxylic acid, butanepentacarboxylic acid, butaneheptacarboxylic acid, cyclopentanepentacarboxylic acid, cyclohexanepentacarboxylic acid, cyclohexanehexacarboxylic acid, adamantanepentacarboxylic acid, adamantanehexacarboxylic acid, etc.; as well as their ester derivatives, acid anhydrides and the like; however, the invention is not limited to these examples. Also preferred for use herein are those prepared by adding any of oxyacids or their derivatives or their combinations of a plurality of such oxyacids, such as l-lactide, d-lactide, hydroxybenzoic acid or the like, to the carboxy terminal of the above-mentioned carboxylic acid constitutive ingredients. These may be used here either singly or, if desired, as a combination of plural types thereof.

Examples of the constitutive ingredient (p) in which the number of the hydroxyl groups (b) is at least 3 include, as a trifunctional aromatic constitutive ingredient, trihydroxybenzene, trihydroxynaphthalene, trihydroxyanthracene, trihydroxychalcone, trihydroxyflavone, trihydroxycoumarin, etc.; as a trifunctional aliphatic alcohol constitutive ingredient (p), glycerin, trimethylolpropane, propanetriol, etc.; as a tetrafunctional aliphatic alcohol constitutive ingredient, pentaerythritol and other compounds. In addition, the constitutive ingredients (p) prepared by adding any diol to the hydroxyl group terminal of the above-mentioned compounds are also preferably used here. These may be used either singly or, if desired, as a combination of plural types thereof.

As the other constitutive ingredients (p), there are mentioned those, in which the total of the carboxylic acid group number (a) and the hydroxyl group number (b), (a+b) in one molecule is at least 3, of oxyacids having both hydroxyl group(s) and carboxylic acid group(s) in one molecule such as hydroxyisophthalic acid, hydroxyterephthalic acid, dihydroxyterephthalic acid, dihydroxyisophthalic acid, etc. Also preferred for use herein are those prepared by adding any of oxyacids or their derivatives or their combinations of a plurality of such oxyacids, such as l-lactide, d-lactide, hydroxybenzoic acid or the like, to the carboxy terminal of the above-mentioned constitutive ingredients. These may be used here either singly or, if desired, as a combination of plural types thereof.

In the polyester film of the invention, preferably, the content of the above-mentioned, trifunctional or more polyfunctional constitutive ingredient (p) is from 0.005 mol % to 2.5 mol % of all the constitutive ingredients in the polyester film. More preferably, the content is from 0.020 mol % to 1 mol %, even more preferably from 0.025 mol % to 1 mol %, still more preferably from 0.035 mol % to 0.5 mol %, further more preferably from 0.05 mol % to 0.5 mol %, especially preferably from 0.1 mol % to 0.25 mol %.

The presence of the trifunctional or more polyfunctional constitutive ingredient in the polyester film enables the branching of the polyester molecular chains from the trifunctional or more polyfunctional constitutive ingredient and promotes the entanglement between the polyester molecules. As a result, even though the polyester molecules are hydrolyzed and the molecular weight of the polyester is thereby lowered during high-temperature high-humidity aging in a weather resistance test, embrittlement of the polyester film could be prevented owing to the entanglement and the film could attain high weather resistance. Further, it has been found that the entanglement of the type is effective also for inhibiting thermal shrinkage. This would be because the mobility of the polyester molecules could lower owing to the entanglement of the polyester molecules and therefore, even though the molecules desire to shrink under heat, they could not shrink so that the thermal shrinkage of the polyester film could be thereby prevented.

Accordingly, when the amount of the trifunctional or more polyfunctional constitutive ingredient (p) is at least 0.005 mol %, then the weather resistance and the thermal shrinkage resistance of the film could be enhanced more. On the other hand, when the amount of the trifunctional or more polyfunctional constitutive ingredient (p) is at most 2.5 mol %, then there is little difficulty in crystal formation to be caused by the bulky trifunctional or more polyfunctional constitutive ingredient. As a result, the formation of low-mobility ingredients to be formed via crystals can be thereby promoted, and the hydrolyzability of the film can be prevented from lowering. Further, the free volume (intermolecular space) that may increase owing to the bulkiness of the trifunctional or more polyfunctional constitutive ingredient could be reduced, and therefore the thermal shrinkage of the film to be caused by the polyester molecules passing through a large free volume in the film can be prevented. In addition, Tg depression to be accompanied by excessive addition of the trifunctional or more polyfunctional constitutive ingredient could be prevented, which is effective for preventing the weather resistance of the film from being lowered.

In the invention, preferably, the polyester film contains a terminal blocking agent. Preferred examples of the terminal blocking agent are isocyanate compounds, carbodiimide compounds and epoxy compounds. These may be used either singly or as combined. Specifically, the terminal blocking agent existing in the film reacts with the carboxylic acid at the polyester terminal and is effective for readily controlling the AV value to fall within the scope defined in the invention. (In other words, the terminal blocking agent prevents hydrolysis of the polyester to be promoted by the terminal carboxylic acid, and therefore the weather resistance of the film can be kept high.) Further, the terminal blocking agent is bulky and therefore prevents the polyester molecules from running and moving through the free volume in the film. As a result, the agent has another effect of preventing thermal shrinkage of the film accompanied by molecular movement in the film.

Preferably, the content of the terminal blocking agent in the polyester film is from 0.1% by mass to 5% by mass of the film, more preferably from 0.3% by mass to 4% by mass, even more preferably from 0.5% by mass to 2% by mass. When the content is at least 0.1% by mass, then the weather resistance of the film could be enhanced owing to the above-mentioned AV-reducing effect thereof, and in addition, the thermal shrinkage of the film could be reduced. On the other hand, when the content is at most 5% by mass, then the depression of the glass transition temperature (Tg) of the polyester to be caused by the addition of the terminal blocking agent could be prevented, and the weather resistance of the film can be prevented from lowering and the thermal shrinkage thereof can be prevented from increasing. This is because the increase in the hydrolyzability of the film to be caused by the increase in the reactivity of the polyester relatively to the Tg depression thereof can be prevented, and the thermal shrinkage of the film to be caused by the increase in the mobility of the polyester molecules through Tg depression thereof can be prevented.

The terminal blocking agent is an additive that reacts with the carboxyl group at the terminal of a polyester to thereby reduce the carboxyl terminal amount of the polyester, and is preferably a compound having a carbodiimide group, an epoxy group or an oxazoline group.

The carbodiimide compound having a carbodiimide group includes a monofunctional carbodiimide and a polyfunctional carbodiimide. The monofunctional carbodiimide includes dicyclohexylcarbodiimide, diisopropylcarbodiimide, dimethylcarbodiimide, diisobutylcarbodiimide, dioctylcarbodiimide, t-butyl-isopropyl-carbodiimide, diphenylcarbodiimide, di-t-butylcarbodiimide, di-β-naphthylcarbodiimide, etc. Especially preferred are dicyclohexylcarbodiimide and diisopropylcarbodiimide.

The polyfunctional carbodiimide is preferably a carbodiimide having a degree of polymerization of from 3 to 15. Concretely, examples of the compound include 1,5-naphthalenecarbodiimide, 4,4'-diphenylmethanecarbodiimide, 4,4-diphenyldimethylmethanecarbodiimide, 1,3-phenylenecarbodiimide, 1,4-phenylenecarbodiimide, 2,4-tolylenecarbodiimide, 2,6-tolylenecarbodiimide, mixture of 2,4-tolylenecarbodiimide and 2,6-tolylenecarbodiimide, hexamethylenecarbodiimide, cyclohexane-1,4-carbodiimide, xylylenecarbodiimide, isophoronecarbodiimide, isophoronecarbodiimide, dicyclohexylmethane-4,4'-carbodiimide, methylcyclohexanecarbodiimide, tetramethylxylylenecarbodiimide, 2,6-diisopropylphenylcarbodiimide, 1,3,5-triisopropylbenzene-2,4-carbodiimide, etc.

Carbodiimide compounds generate an isocyanate-type gas through thermal decomposition, and therefore, carbodiimide compounds having high heat resistance are preferred for use herein. For increasing the heat resistance thereof, the molecular weight (degree of polymerization) of the compound is preferably higher, and more preferably, the terminal of the carbodiimide compound has a structure having high heat resistance. In addition, since the compound that has been once thermally decomposed may induce further thermal decomposition thereof, and therefore, some means would be necessary for lowering as much as possible the extrusion temperature of polyester.

Preferably, the isocyanate-type gas generation from the polyester film of the invention, to which the carbodiimide compound of the type is added, at a temperature of 300° C. for 30 minutes is from 0 to 0.02% by mass. The isocyanate-type gas means a gas having an isocyanate group, including, for example, diisopropylphenyl isocyanate, 1,3,5-triisopropyl-phenyl diisocyanate, 2-amino-1,3,5-triisopropyl-phenyl-6-isocyanate, 4,4'-dicyclohexylmethane diisocyanate, isophorone diisocyanate, cyclohexyl isocyanate, etc. When the amount of the isocyanate-type gas oversteps the above range, then voids may be formed in the polyester film and these may be stress-focusing points in the adhesiveness test, in which, therefore, the polyester film may be broken and peeled. As a result, the film may often experience adhesion failure.

Preferred examples of the epoxy compounds include glycidyl ester compounds, glycidyl ether compounds, etc.

Specific examples of the glycidyl ester compounds are glycidyl benzoate, glycidyl t-Bu-benzoate, glycidyl p-toluate, glycidyl cyclohexanecarboxylate, glycidyl pelargonate, glycidyl stearate, glycidyl laurate, glycidyl palmate, glycidyl behenate, glycidyl versatate, glycidyl oleate, glycidyl linolate, glycidyl linolenate, glycidyl behenolate, glycidyl stearolate, diglycidyl terephthalate, diglycidyl isophthalate, diglycidyl phthalate, diglycidyl naphthalenedicarboxylate, diglycidyl methylterephthalate, diglycidyl hexahydrophthalate, diglycidyl tetrahydrophthalate, diglycidyl cyclohexanedicarboxylate, diglycidyl adipate, diglycidyl succinate, diglycidyl sebacate, diglycidyl dodecanedioate, diglycidyl octadecanedicarboxylate, triglycidyl trimellitate, tetraglycidyl pyromellitate, etc. One or more of these may be used here.

Specific examples of the glycidyl ether compounds are phenyl glycidyl ether, O-phenyl glycidyl ether, 1,4-bis(β,γ-epoxypropoxy)butane, 1,6-bis(β,γ-epoxypropoxy)hexane, 1,4-bis(β,γ-epoxypropoxy)benzene, 1-(β,γ-epoxypropoxy)-2-ethoxyethane, 1-(β,γ-epoxypropoxy)-2-benzyloxyethane, 2,2-bis-[p-(β,γ-epoxypropoxy)phenyl]propane, as well as bisglycidyl polyethers obtained through reaction of bisphenol such as 2,2-bis(4-hydroxyphenyl)propane, 2,2-bis-(4-hydroxyphenyl)methane or the like with epichlorohydrin, etc. One or more of these may be used here.

As the oxazoline compounds, preferred are bisoxazoline compounds; and concretely, their examples are 2,2'-bis(2-oxazoline), 2,2'-bis(4-methyl-2-oxazoline), 2,2'-bis(4,4-dimethyl-2-oxazoline), 2,2'-bis(4-ethyl-2-oxazoline), 2,2'-bis(4,4'-diethyl-2-oxazoline), 2,2'-bis(4-propyl-2-oxazoline), 2,2'-bis(4-butyl-2-oxazoline), 2,2'-bis(4-hexyl-2-oxazoline), 2,2'-bis(4-phenyl-2-oxazoline), 2,2'-bis(4-cyclohexyl-2-oxazoline), 2,2'-bis(4-benzyl-2-oxazoline), 2,2'-p-phenylenebis(2-oxazoline), 2,2'-m-phenylenebis(2-oxazoline), 2,2'-o-phenylenebis(2-oxazoline), 2,2'-p-phenylenebis(4-methyl-2-oxazoline), 2,2'-p-phenylenebis(4,4-dimethyl-2-oxazoline), 2,2'-m-phenylenebis(4-methyl-2-oxazoline), 2,2'-m-phenylenebis(4,4-dimethyl-2-oxazoline), 2,2'-ethylenebis(2-oxazoline), 2,2'-tetramethylenebis(2-oxazoline), 2,2'-hexamethylenebis(2-oxazoline), 2,2'-octamethylenebis(2-oxazoline), 2,2'-decamethylenebis(2-oxazoline), 2,2'-ethylenebis(4-methyl-2-oxazoline), 2,2'-tetramethylenebis(4,4-dimethyl-2-oxazoline), 2,2'-9,9'-diphenoxyethanebis(2-oxazoline), 2,2'-cyclohexylenebis(2-oxazoline), 2,2'-diphenylenebis(2-oxazoline), etc. Of those, most preferred for use herein is 2,2'-bis(2-oxazoline) from the viewpoint of the reactivity thereof with polyester. One or more different types of the above-mentioned bisoxazoline compounds may be used here either singly or as combined, so far as they attain the object of the invention.

PET may differ depending on the catalyst used, which will be mentioned below. PET produced by the use of one or more selected from a germanium (Ge) catalyst, an antimony (Sb) catalyst, an aluminium (Al) catalyst and a titanium (Ti) catalyst is preferred; and more preferred is PET produced by the use of a Ti catalyst.

In esterification and/or transesterification, any known conventional reaction catalyst may be used. The reaction catalyst includes alkali metal compounds, alkaline earth metal compounds, zinc compounds, lead compounds, manganese compounds, cobalt compounds, aluminium compounds, antimony compounds, titanium compounds, germanium compounds, phosphorus compounds. In general, in any stage before the completion of the polyester production method, preferably, an antimony compound, a germanium compound or a titanium compound is added as the polymerization catalyst. For example, a germanium compound is referred to for the method, and preferably, a germanium compound powder is added to the reaction system directly as it is.

The polyester film production method of the invention preferably includes a step of preparing the polyester resin to be formed into a film through melt extrusion, according to esterification with a Ti catalyst.

The polyester film formed of the polyester resin that is produced through esterification with a Ti catalyst is preferred since its weather resistance worsens little. Not adhering to any theory, the reason may be considered as follows: The weather resistance degradation of a weather-resistant polyester film may depend on the hydrolysis of the polyester in some degree. The esterification catalyst may promote also hydrolysis that is the counter-reaction to esterification, however, the Ti catalyst catalyzes little the counter-reaction hydrolysis. Accordingly, even though the esterification catalyst may remain in some degree in the formed polyester film, the polyester resin esterified by the use of the Ti catalyst may have relatively high weather resistance than the polyester resin esterified by the use of any other catalyst.

The Ti catalyst has high reactivity and the polymerization temperature with the catalyst may be low. Accordingly, PET may be prevented from being thermally degraded to generate COOH during polymerization with the catalyst, and in the polyester film of the invention, the catalyst is favorable for controlling AV (terminal COOH content) in the film to fall with the above-mentioned preferred range.

The Ti catalyst includes oxides, hydroxides, alkoxides, carboxylates, carbonates, oxalates, organic chelate titanium complexes, and halides. For the Ti catalyst, two or more different types of titanium compounds may be used not detracting from the effect of the invention.

Examples of the Ti catalyst includes titanium alkoxides such as tetra-n-propyl titanate, tetra-i-propyl titanate, tetra-n-butyl titanate, tetra-n-butyl titanate tetramer, tetra-t-butyl titanate, tetracyclohexyl titanate, tetraphenyl titanate, tetrabenzyl titanate; titanium oxides to be produced through hydrolysis of titanium alkoxides; titanium-silicon or zirconium composite oxides to be produced through hydrolysis of a mixture of titanium alkoxide and silicon alkoxide or zirconium alkoxide; and titanium acetate, titanium oxalate, potassium titanium oxalate, sodium titanium oxalate, potassium titanate, sodium titanate, titanic acid-aluminium hydroxide mixture, titanium chloride, titanium chloride-aluminium chloride mixture, titanium acetylacetonate, and organic chelate titanium complexes with an organic acid as the ligand therein.

Of the above-mentioned Ti catalysts, preferred for use herein is at least one organic chelate titanium complex with an organic acid as the ligand therein. The organic acid includes, for example, citric acid, lactic acid, trimellitic acid, malic acid. Above all, preferred is an organic chelate complex with citric acid or a citrate salt as the ligand therein.

For example, when a chelate titanium complex with citric acid as the ligand therein is used, impurities such as fine particles form little and a polyester resin of high polymerization activity with a good color tone can be produced as compared with that produced by the use of any other titanium compound. Further, in case where a citrate chelate titanium complex is used and when it is added during esterification, a polyester resin of good polymerization activity with a good color tone, in which the terminal carboxyl content is small, can be obtained as compared with the case where the complex catalyst is added after the esterification. This may be considered because of the following reason. The titanium catalyst has a catalyst effect for esterification and when it is added during esterification, then the oligomer acid value after the esterification may below, and therefore the subsequent polycondensation may be attained efficiently; and the complex with citric acid as the ligand therein has higher hydrolysis resistance than titanium alkoxide and is not hydrolyzed during the esterification process and, while having its intrinsic activity, the complex catalyst can effectively function as the catalyst for esterification and polycondensation reaction.

In general, it is known that the hydrolysis resistance of a resin having a larger terminal carboxyl content worsens more; and according to the addition method in the invention, the terminal carboxyl content in the resin produced may be smaller, and therefore the hydrolysis resistance of the resin is expected to be better.

The citrate chelate titanium complex is available as a commercial product, for example, as Johnson Massey's VERTE-CAC-420.

In this case, the Ti catalyst amount is preferably from 1 ppm to 30 ppm, more preferably from 2 ppm to 25 ppm, even more preferably from 3 ppm to 20 ppm. Adding a phosphorus compound is preferred as enhancing the effect of the catalyst.

When the amount of the Ti compound is at least 1 ppm in terms of the Ti element, then the polymerization speed may be high and a resin having a preferred IV can be produced. When the amount of the Ti compound is at most 30 ppm in terms of the Ti element, then the resin produced may be controlled to have AV (terminal COOH content) falling within the above-mentioned range, and the resin film may have a good color tone.

For producing Ti-based polyesters by the use of such Ti compound, for example, employable are the methods described in JP-A 8-30119; Japanese Patents 2543624, 3335683, 3717380, 3897756, 3962226, 3979866, 3996871, 4000867, 4053837, 4127119, 4134710, 4159154, 4269704, 4313538; JP-A 2005-340616, 2005-239940, 2004-319444, 2007-204538; Japanese Patents 3436268 and 3780137.

Preferably in the invention, the polyester resin is produced according to a method including at least an esterification step where an aromatic dicarboxylic acid and an aliphatic diol are polymerized in the presence of a catalyst containing a titanium compound, where at least one titanium compound is an organic chelate titanium complex with an organic acid as the ligand therein and where the organic chelate titanium complex and a magnesium compound and a pentavalent phosphate not having an aromatic ring as the substituent are added in that order. In this case, more preferably, the polyester film of the invention is produced according to the polyester resin production method that comprises, in addition to the esterification step, a polycondensation step of polycondensing the esterified product produced in the esterification step to give a polycondensate. The polycondensation step is described below.

In the above embodiment, a magnesium compound is added to the system where an organic chelate titanium complex exists as the titanium compound in the esterification step, and then a specific pentavalent phosphorus compound is subsequently added thereto, whereby the reaction activity of the titanium catalyst is kept suitably high, and while the static electricity-imparting property of magnesium is applied to the system, the polycondensation degradation can be effectively inhibited; and as a result, therefore, a polyester film is produced which discolors little and has good static electricity-imparting property and which yellows little when exposed to high temperatures.

Accordingly, the polyester resin yellows little during polymerization and yellows little during formation into film; and as compared with the polyester resin produced by the use of a conventional antimony (Sb) catalyst, the resin film yellows little; and comparable to the polyester resin film produced by the use of a germanium catalyst and having a relatively high transparency, the resin film produced has a good color tone and good transparency and has excellent heat resistance. In addition, the polyester film produced has high transparency and yellows little even when a coloration regulator such as a cobalt compound or a colorant is not used therein.

The polyester resin is usable in applications where the requirement for transparency is high (for example, for optical films, industrial lithography), and does not require use of an expensive germanium catalyst, and therefore, the cost for it can be greatly reduced. In addition, catalyst-caused impurities that often form in use of Sb catalysts can be prevented from mixing in the film, and therefore the film is free from accident in the production process and free from quality failure, and the cost reduction can be further augmented by production yield enhancement.

In case where the aromatic dicarboxylic acid and the aliphatic diol are mixed with the catalyst that contains an organic chelate titanium complex of a titanium compound, prior to addition of a magnesium compound and a phosphorus compound thereto, the organic chelate titanium complex has high catalyst activity also to esterification, and therefore favorably catalyzes esterification. In this case, the titanium compound may be added to the mixture of a dicarboxylic acid component and a diol component. Alternatively, after the dicarboxylic acid component (or the diol component) is mixed with the titanium compound, and then the diol component (or the dicarboxylic acid component) may be mixed therein. In another case, the dicarboxylic acid component, the diol component and the titanium compound may be mixed simultaneously. The mixing method is not specifically defined, and the components may be mixed in any known conventional method.

In the esterification, preferably, the titanium compound of an organic chelate titanium complex and the additives of a magnesium compound and a pentavalent phosphorus compound are added to the system in that order. In this case, the esterification is promoted in the presence of the organic chelate titanium complex, and subsequently the magnesium compound is added prior to the addition of the phosphorus compound.

As the pentavalent phosphorus compound, usable is at least one pentavalent phosphate not having an aromatic ring as the substituent. The pentavalent phosphate includes, for example, trimethyl phosphate, triethyl phosphate, tri-n-butyl phosphate, trioctyl phosphate, tris(triethylene glycol) phosphate, methyl acid phosphate, ethyl acid phosphate, isopropyl acid phosphate, butyl acid phosphate, monobutyl phosphate, dibutyl phosphate, dioctyl phosphate, triethylene glycol acid phosphate.

As the pentavalent phosphate, preferred are phosphates having a lower alkyl group with at least 2 carbon atoms as the substituent [$(OR)_3$—P=O; R=alkyl group having 1 or 2 carbon atoms]; and concretely, trimethyl phosphate and triethyl phosphate are especially preferred.

In particular, in case where a chelate titanium complex where citric acid or its salt is coordinated as the ligand is used as the titanium compound catalyst, use of a pentavalent phosphate is more preferred than use of a trivalent phosphate since the resin produced may enjoy both good polymerization activity and good color tone; and especially when a pentavalent phosphate in which the substituent has at most 2 carbon atoms is used, the resin produced may have well balanced polymerization activity, color tone and heat resistance.

The amount of the phosphorus compound to be added is preferably within a range of from 50 ppm to 90 ppm in terms of the P element. More preferably, the amount of the phosphorus compound is from 60 ppm to 80 ppm, even more preferably from 65 ppm to 75 ppm.

Adding a magnesium compound improves the static electricity imparting property of the resin film. In this case, the film may often yellow, but in the invention, the yellowing may be retarded, and the film produced discolors little and had excellent color tone and heat resistance.

The magnesium compound includes, for example, magnesium oxide, magnesium hydroxide, magnesium alkoxide, magnesium acetate, magnesium carbonate and other magnesium salts. Above all, most preferred is magnesium acetate from the viewpoint of the solubility thereof in ethylene glycol.

For imparting high static electricity-imparting property to the film, the amount of the magnesium compound to be added thereto is preferably at least 50 ppm in terms of the Mg element, more preferably from 50 ppm to 100 ppm. Even more preferably, the amount of the magnesium compound to be added is from 60 ppm to 90 ppm from the viewpoint of the static electricity-imparting property thereof, still more preferably from 70 ppm to 80 ppm.

Preferably in the esterification step, the catalyst component of the titanium compound and the additives of the magnesium compound and the phosphorus compound are added to the melt polymerization system in such a manner that the value Z to be computed from the following formula (i) could satisfy the following relational formula (ii). In this, the P content is the phosphorus content derived from all the phosphorus compounds including the pentavalent phosphate not having an aromatic ring; and the Ti content is the titanium content derived from all the Ti compounds including the organic chelate titanium complex. In that manner, by selecting the combination of the magnesium compound and the phosphorus compound in the titanium compound-containing catalyst system and by controlling the addition timing and the addition ratio, the resin film that yellows little and has a good color tine is produced while the catalytic activity of the titanium compound is suitably kept high; and even when exposed to high temperatures during the polymerization and during the subsequent film formation (through melting), the produced resin yellows little and has good heat resistance.

$$Z=5\times(\text{P content [ppm]/P atomic weight})-2\times(\text{Mg content [ppm]/Mg atomic weight})-4\times(\text{Ti content [ppm]/Ti atomic weight}) \qquad (i)$$

$$+0 \le Z \le +5.0 \qquad (ii)$$

The phosphorus compound interacts not only with the titanium compound but also with the magnesium compound, and therefore, the above is an index of quantitatively expressing the balance of the three.

The above formula (i) indicates the amount of phosphorus that reacts with titanium, in which the phosphorus fraction to react with magnesium is subtracted from all the reactive phosphorus amount. When the value Z is positive, it means that the phosphorus that interferes with titanium is excessive; and on the contrary, when the value is negative, it means that the phosphorus necessary for interfering with titanium is insufficient. In the reaction, one atom of Ti, Mg and P is not equivalent to each other, and therefore the molar number in the formula is multiplied by the number of valence for weighting.

In the invention, titanium compound, phosphorus compound and magnesium compound that do not require any specific production but are inexpensive and are easily available are used, and while maintaining the reactivity of those compounds necessary for the reaction, a polyester resin can be produced that has a good color tone and is excellent in discoloration resistance under heat.

Regarding the formula (ii), preferably $+1.0 \le Z \le +4.0$, and more preferably $+1.5 \le Z \le +3.0$ from the viewpoint of further bettering the color tone of the resin and enhancing the discoloration resistance under heat thereof with maintaining good polymerization reactivity thereof.

In a preferred embodiment of the invention, a chelate titanium compound with citric acid or a citrate salt as the ligand therein is added in an amount of from 1 ppm to 30 ppm to the aromatic dicarboxylic acid and the aliphatic diol before the end of the esterification, and in the presence of the chelate titanium complex, a magnesium salt of a weak acid is added in an amount of from 60 ppm to 90 ppm, preferably from 70 ppm to 80 ppm, and after the addition, a pentavalent phosphate ester not having an aromatic ring as the substituent is added thereto in an amount of from 60 ppm to 80 ppm, preferably from 65 ppm to 75 ppm.

The esterification may be carried out using a multistage unit of at least two reactors connected in series, in which ethylene glycol is kept under reflux and water and alcohol formed by the reaction are removed out of the system.

A slurry of the dicarboxylic acid and the diol is prepared, and this is continuously fed into the esterification reaction unit.

The esterification may be attained in one stage or in multiple stages.

(b) Polycondensation:

The esterified product produced by the esterification is the polycondensed to give a polycondensate product. The polycondensation may be attained in one stage or in multiple stages.

The esterified product such as an oligomer or the like produced in the esterification is subsequently processed for polycondensation. The polycondensation may be favorably attained by feeing the esterified product into a polycondensation tank unit.

For example, in case where the polycondensation is attained in a three-stage reaction tank unit, a preferred embodiment of the polycondensation condition is as follows: In the first reaction tank, the reaction temperature is from 255 to 280° C., more preferably from 265 to 275° C., and the pressure is from $13.3 \times 10^{-3}$ to $1.3 \times 10^{-3}$ MPa (100 to 10 Torr), more preferably from $6.67 \times 10^{-3}$ to $2.67 \times 10^{-3}$ MPa (50 to 20 Torr); in the second reaction tank, the reaction temperature is from 265 to 285° C., more preferably from 270 to 280° C., and the pressure is from $2.67 \times 10^{-3}$ to $1.33 \times 10^{-4}$ MPa (20 to 1 Torr), more preferably from $1.33 \times 10^{-3}$ to $4.0 \times 10^{-4}$ MPa (10 to 3 Torr); and in the third reaction tank in the final reaction tank; the reaction temperature is from 270 to 290° C., more preferably from 275 to 285° C., and the pressure is from $1.33 \times 10^{-3}$ to $1.33 \times 10^{-5}$ MPa (10 to 0.1 Torr), more preferably from $6.77 \times 10^{-4}$ to $6.77 \times 10^{-5}$ MPa (5 to 0.5 Torr).

Produced according to the method that comprises the esterification step and the polycondensation step, the polyester resin composition contains titanium atom (Ti), magnesium atom (Mg) and phosphorus atom (P) of which the value Z computed from the following formula (i) satisfies the following relational formula (ii):

$$Z = 5 \times (\text{P content [ppm]/P atomic weight}) - 2 \times (\text{Mg content [ppm]/Mg atomic weight}) - 4 \times (\text{Ti content [ppm]/Ti atomic weight}) \quad (i)$$

$$+0 \leq Z \leq +5.0 \quad (ii)$$

Satisfying $+0 \leq Z \leq +5.0$, the polyester resin composition is suitably well balanced in point of the three elements of Ti, P and Mg therein, and therefore, the resin film has a good color tone and is excellent in heat resistance (not yellowing at high temperatures) while maintaining good polymerization reactivity, and can have good static electricity-imparting property. In the invention, not using a coloration regulator such as a cobalt compound or a dye therein, the polyester resin obtained may have high transparency and yellows little.

As described above, the formula (i) is to quantitatively express the balance of the three, phosphorus compound, magnesium compound and titanium compound, and expresses the amount of phosphorus capable of reacting with titanium as computed by subtracting the phosphorus amount to react with magnesium from all the reactable phosphorus amount. When the value Z is less than +0, or that is, when the amount of phosphorus to react with titanium is too small, then the catalytic activity (polymerization reactivity) of titanium may increase but the heat resistance of the produced resin may lower, and therefore the obtained polyester resin may yellow and may discolor during film formation (through melting) after polymerization, and the color tone of the resin worsens. When the value Z is more than +5.0, or that is, when the amount of phosphorus to react with titanium is too large, then the heat resistance and the color tone of the obtained polyester may be good but the catalyst activity may lower too much and the producibility may therefore lower.

In the invention, for the same reason as above, the formula (ii) preferably satisfies $1.0 \leq Z \leq 4.0$, more preferably $1.5 \leq Z \leq 3.0$.

The elements of Ti, Mg and P may be measured through high-resolution inductively-coupled plasma-mass spectrometry (HR-ICP-MS with SII Nanotechnology's AttoM), in which the elements constituting the PET sample are quantitatively determined, and the content [ppm] of each element is computed from the found data.

Preferably, the polyester resin composition produced satisfies the following relational formula (iii):

$$\text{Value } b \text{ of pellets after polycondensation } 4.0 \quad (iii)$$

When the polyester resin produced through polycondensation is pelletized and when the value b of the pellets is at most 4.0, then the resin yellows little and has excellent transparency. When the value b is at most 3.0, then the color tone of the obtained resin is comparable to that of the polyester resin produced through polymerization with a Ge catalyst.

The value b is an index that indicates the color of resin, and is measured with ND-101D (by Nippon Denshoku Kogyo).

Preferably, the polyester resin composition satisfies the following relational formula (iv):

$$\text{Discoloration Rate } [\Delta b/\text{min}] \leq 0.15 \quad (iv)$$

When the polyester resin pellets obtained through polycondensation are kept melted at 300° C. and when the discoloration rate [$\Delta b$/min] thereof is at most 0.15, then the resin yellows little in exposure to heat. Accordingly, for example, when the resin is formed into a film by extrusion through an extruder, the film to be obtained yellows little and has a good color tone.

The discoloration rate is preferably smaller, and is more preferably at most 0.10.

The discoloration rate is an index that indicates the color change under heat, and is obtained according to the following method. Briefly, pellets of the polyester resin composition are put into a hopper of an injection molding machine (for example, Toshiba Machine's EC100NII), and kept melted in the cylinder (300° C.). The retention time is varied and the melt is shaped into a plate, and the value b of the plate is measured with ND-101D (by Nippon Denshoku Kogyo). Based on the change of the value b, the discoloration rate [$\Delta b$/min] is computed.

—Solid-Phase Polymerization Step—

Preferably, the polyester film production method of the invention includes a step of heat-treating a polyester resin at 190° C. to 230° C. for 10 to 80 hours to thereby prepare the polyester resin to be processed for melt casting film formation, from the viewpoint of controlling the values AV and IV of the resin each to fall within the preferred range.

Specifically, the polyester film production method of the invention preferably includes a solid-phase polymerization step of producing the polyester to be used in the method through solid-phase polymerization. For the solid-phase polymerization, preferably, a polyester produced through known esterification polymerization or a commercially-available polyester is formed into small pieces such as pellets.

Preferably, the solid-phase polymerization temperature is from 190 to 230° C., more preferably from 200° C. to 220° C., even more preferably from 205° C. to 215° C.

Preferably, the solid-phase polymerization time is from 10 hours to 80 hours, more preferably from 15 hours to 50 hours, even more preferably from 20 hours to 30 hours.

Preferably, the heat treatment is attained in a low-oxygen atmosphere, for example, in a nitrogen atmosphere or in vacuum. A polyalcohol (e.g., ethylene glycol) may be mixed in the system in an amount of from 1 ppm to 1%, more preferably 20 ppm to 1000 ppm, still more preferably 40 ppm to 500 ppm. The solid-phase polymerization at the atmosphere of ethylene glycol (EG) effectively suppresses the reduction of IV (decomposition of polyester resins) in the extruder. This is because the EG is captured into the polyester resins during the solid-phase polymerization and bonded with the decomposed polyesters (esterfication) to suppress the reduction of IV (to suppress decrease of the molecular weight). When the content of the polyalcohol is adjusted to be higher than the lower limit of the invention, the reduction of IV can be suppressed by the above esterification. When the content of the polyalcohol is adjusted to be lower than the upper limit of the invention, the reduction of IV caused by acceleration of decomposition due to reduction of the glass transition temperature (Tg) can be suppressed. Such reduction of IV is particularly apt to be observed in the IV range of 0.7 to 0.8. In the range under 0.7, the viscosity of the melt and heat generated by share are low and the polyesters hardly decompose. In the range over 0.8, the molecular weight increases and the amount of terminal carboxylic acid which can accelerate decomposition of the polyester is reduced.

The solid-phase polymerization may be in a batchwise mode (where the resin is put into a reactor and is stirred therein under heat for a predetermined period of time), or may be in a continuous mode (where the resin is put into a heated cylinder, and while kept remaining therein under heat for a predetermined period of time, the resin is led to pass through the cylinder and sequentially led out of it).

(Polyester Film Formation)
(1) Melt Extrusion, Film Formation:

In the production method of the invention, preferably, the polyester after the solid-phase polymerization step is melt-kneaded and extruded through a nozzle (extrusion die) to form a polyester film.

Preferably, the polyester obtained in the solid-phase polymerization step is dried. For example, the residual moisture in the polyester is preferably at most 100 ppm.

In the production method of the invention, the polyester resin may be melted in an extruder. The melt temperature is preferably from 250° C. to 320° C., more preferably from 260° C. to 310° C., even more preferably from 270° C. to 300° C.

The extruder may be a single-screw extruder or a multi-screw extruder. From the viewpoint of preventing the generation of terminal COOH through thermal decomposition, preferably, the extruder is purged with nitrogen.

Prior to melt extrusion of the polyester resin, inorganic fine particles may be added thereto. The inorganic fine particles include, for example, silica, alumina, titania, zirconia, talc, calcium carbonate, kaolin, layered mica, barium sulfate, aluminium hydroxide, zinc oxide, calcium phosphate. Of those, preferred is calcium phosphate as excellent in lubricity and having good adhesiveness to resin, and as therefore hardly peeling from resin in long-term use.

In case where calcium phosphate is added, its amount is preferably from 20 to 500 ppm in terms of ratio by weight to the polyester resin, more preferably from 50 to 250 ppm, even more preferably from 70 to 200 ppm.

Preferably, the melt of the polyester resin extruded out through an extrusion die via a gear pump and a filter unit. In this, the melt may be extruded as a single layer or as multiple layers.

When the resin melt is extruded out (for example, through a die), preferably, the shear rate in extrusion is controlled to fall within a desired range. The shear rate in extrusion is preferably from $1\ s^{-1}$ to $300\ s^{-1}$, more preferably from $10\ s^{-1}$ to $200\ s^{-1}$, even more preferably from $30\ s^{-1}$ to $150\ s^{-1}$. Accordingly, there occurs a die swell in extrusion through the die (a phenomenon of expansion of the melt in the thickness direction thereof). Since stress is given to the melt in the thickness direction thereof (film normal line direction), the molecular movement in the thickness direction of the melt is promoted and the COOH group and the OH group may be made to exist in that direction. When the shear rate is not lower than $1\ s^{-1}$, then the COOH group and the OH group may be sufficiently led into the inside of the melt; and when not higher than $300\ s^{-1}$, then the COOH group and the OH group may be made to exist in the film surface.

After the resin melt is extruded out (for example, through a die) and before it is brought into contact with a casting roll (in the air gap), preferably, the relative humidity is controlled to be from 5 to 60%, more preferably from 10 to 55%, even more preferably from 15 to 50%. When the relative humidity in the air gap falls within the above range, then the hydrophobicity or air may be controlled and the movement of the COOH group and the OH group from the film surface may be thereby controlled.

Preferably, the extruded melt is cooled on the support and solidified to form a film thereon.

The support is not specifically defined, for which is usable a chill roll generally used in ordinary melt casting film formation.

The temperature of the chill roll is preferably from 10° C. to 80° C., more preferably from 15° C. to 70° C., even more preferably from 20° C. to 60° C. From the viewpoint of enhancing the adhesiveness between the resin melt and the chill roll and of increasing the cooling efficiency, preferably, static electricity is applied to the chill roll before the melt is brought into contact therewith.

After solidified (but before stretched), the thickness of the strip-like extruded resin melt may be within a range of from 2600 μm to 6000 μm; and after subsequently stretched, a polyester film having a thickness of from 260 μm to 400 μm is obtained. Preferably, the thickness of the solidified melt is within a range of from 3100 μm to 6000 μm, more preferably from 3300 μm to 5000 μm, even more preferably from 3500 μm to 4500 μm. When the thickness of the solidified but unstretched film is at most 6000 μm, the film hardly wrinkles during melt extrusion and is prevented from having thickness unevenness. Preferably, the thickness of the solidified but unstretched film is at lest 2600 μm, since the adhesion unevenness to the chill roll (for solidification thereon) to be caused by poor toughness of the melt may be prevented and since the film thickness unevenness may be reduced.

(Stretching Step)

The production method of the invention includes a step of stretching the extruded film (unstretched film) after the above film formation step. The mode of stretching is not specifically defined. Preferably, the unstretched film is biaxially stretched to give the polyester film of the invention. The local temperature fluctuation and the wind speed fluctuation in thermal fixation in the invention to be mentioned below are not attained by the stretching unevenness in the stretching step.

In biaxial stretching, the order of longitudinal stretching and lateral stretching is not specifically defined, and any of the two may be attained first. Preferably, the longitudinal stretching is attained first.

Preferably, the film is stretched at most three times each for longitudinal stretching and lateral stretching, more preferably at most two times each for longitudinal stretching and lateral stretching, even more preferably once for longitudinal stretching and lateral stretching.

Any of longitudinal stretching and lateral stretching may be attained first, but preferably, the longitudinal stretching is attained first. In this case, preferably, the draw ratio in the stretching attained first is higher than the draw ratio in the stretching attained later.

In the production method of the invention, preferably, the lateral draw ratio is larger than the longitudinal draw ratio. More preferably, the lateral draw ratio/longitudinal draw ratio is from 1.03 to 1.3, even more preferably from 1.05 to 1.25, still more preferably from 1.06 to 1.2. In general, the longitudinal draw ratio is followed by the lateral draw ratio; and concretely, the polyester resin first oriented by longitudinal stretching is then re-oriented laterally. In the production method of the invention, the lateral draw ratio is higher whereby the quantity of the longitudinally-aligned molecules and that of the laterally-aligned molecules may be made uniform. As a result, the longitudinally-aligned molecules and the laterally-aligned molecules can be readily entangled, and the entangled points form crosslinked points. The crosslinked points lower the mobility of the molecules, whereby the low-mobility fragment can be formed readily. In the production method of the invention, the above-mentioned range of lateral draw ratio/longitudinal draw ratio is preferred from the viewpoint that, within the range, the polyester film can be prevented from curving in the in-plane direction thereof (that is, the film can be prevented from warping in the film width direction) and therefore the surface condition of the film after thermal fixation can be thereby improved more.

In the production method of the invention, the areal draw ratio in stretching is preferably from 11 times to 18 times, more preferably from 11.5 times to 14.5 times, even more preferably from 12 times to 14 times. The areal draw ratio in stretching as referred to herein means the product of the draw ratio in all the stretching steps. For example, when a film is stretched longitudinally by A times and laterally by B times, then the areal draw ratio is A×B times. When the areal draw ratio is not lower than the lowermost limit of the range, then the molecular alignment can be sufficient, and crystal formation in subsequent thermal fixation can be easy. As a result, the low-mobility fragment is easy to form in which the molecules are bound between crystals and their mobility is thereby lowered. On the other hand, when the areal draw ratio is not higher than the uppermost limit of the range, then it is also favorable since the molecules are not pulled too much and the low-mobility fragment molecules existing between crystals are hardly drawn out from the crystals and the amount of the low-mobility fragment is thereby hardly lowered.

In the polyester film production method of the invention, preferably, the lateral draw ratio/longitudinal draw ratio is from 1.03 to 1.3 times and the areal draw ratio is from 11 to 18 times.

The draw ratio in stretching in each direction is preferably from 3 times to 5 times in the machine direction of the film (film traveling direction) and in the cross direction of the film (direction perpendicular to the film traveling direction).

In the production method of the invention, the stretching temperature is preferably from 80° C. to 160° C., more preferably from 85° C. to 155° C., even more preferably from 90° C. to 150° C. When the temperature is not higher than the uppermost limit of the preferred range, the molecular alignment is not too much lowered in stretching and, as a result, crystals are easy to form in thermal fixation and the low-mobility fragment of which the mobility is lowered owing to fixation in crystals is easy to form. On the other hand, when the temperature is not lower than the lowermost limit of the preferred range, then the polyester molecules are hardly cut during stretching and therefore can have a length (molecular weight) enough to bridge the gap between crystals. As a result, the low-mobility fragment fixed between crystals is easy to form.

In case where the film is biaxially stretched in the production method of the invention, preferably, the stretching temperature in the latter stretching is higher by from 20° C. to 80° C. than the stretching temperature in the former stretching, more preferably by from 30° C. to 70° C., even more preferably by from 40° C. to 60° C. The latter-stage stretching for breaking the alignment once formed in the former-stage stretching and re-aligning the molecules in the direction perpendicular to the former alignment direction, and therefore requires larger energy, and accordingly, the stretching temperature in the latter-stage stretching is preferably higher than that in the former-stage stretching. Accordingly, the molecules can be more readily entangled together to form crosslinked points, and around the points, the mobility of the molecules lowers and the low-mobility fragment is easy to form.

A concrete stretching method is described. For example, preferably, an unstretched polyester film is led to rolls heated at a temperature of from 70° C. to 140° C., then stretched in the machine direction (longitudinal direction, or that is, film-traveling direction) at a draw ratio of from 3 times to 5 times, and thereafter cooled with rolls at a temperature of from 20° C. to 50° C. Subsequently, preferably, the film is led into a tenter with both sides thereof kept clipped, and in an atmosphere heated at a temperature of from 80° C. to 150° C., the film is stretched in the direction perpendicular to the machine direction (cross direction, that is the direction perpendicular to the film conveying direction) at a draw ratio of from 3 times to 5 times.

The biaxial-stretching method may also be a simultaneous biaxial-stretching method where the stretching in the machine direction and that in the cross direction are attained simultaneously, apart from the above-mentioned successive biaxial-stretching method where the stretching in the machine direction and that in the cross direction are attained separately.

In this, preferably, the thickness of the stretched film falls within the preferred range of the thickness of the polyester film of the invention. Not overstepping the lowermost limit of the preferred range of the thickness thereof, the polyester film of the invention can be prevented from curving in the in-plane direction thereof (that is, the film can be prevented from warping in the film width direction) and therefore the surface condition of the film after thermal fixation can be thereby improved more.

(Thermal Fixation)

The first polyester production method of the invention includes a step of thermally fixing the stretched polyester film, and in the thermal fixation step, the film is given a local temperature fluctuation of from 0.1 to 10° C. in the film width direction. The second polyester production method of the invention includes a step of thermally fixing the stretched polyester film, and in the thermal fixation step, the film is given a wind speed fluctuation of from 0.1 to 10% in the film width direction.

The thermal fixation as referred to in this description means a treatment of heating the stretched polyester film with the sides thereof kept fixed.

The first and second production methods are described in detail hereinunder.

(1) First Production Method—Local Temperature Fluctuation—

The polyester film of the invention of which $\Delta Cp$ is controlled to fall within the range defined in the invention is attained by giving a local temperature fluctuation of from 0.1 to 10° C. to the stretched film in the film width direction during thermal fixation of the film. The "local temperature fluctuation" is as follows: In the thermal fixation zone, the film width is divided into ten equal parts, the film surface temperature of each part is measured, the temperature difference between the adjacent parts is computed, and the data are averaged to give a mean value, which is the local temperature fluctuation.

It is preferable to give a local temperature fluctuation in the longitudinal direction also. The local temperature fluctuation is preferably from 0.1 to 10° C. The local temperature fluctuation in the longitudinal direction is determined by measuring the temperature of the surface of the film passing through the thermal fixation zone ten times at 1 second interval, and obtaining an average of the temperature difference between adjoining measuring points ($\Delta t$). This measurement is conducted in 3 different points taken at the same intervals in the width direction to obtain $\Delta t1$, $\Delta t2$ and $\Delta t3$. The average of $\Delta t1$, $\Delta t2$ and $\Delta t3$ is the local temperature fluctuation in the longitudinal direction.

When the local temperature fluctuation falls within the range, then a difference may be given to the amount of the crystals to be formed in the film. Specifically, of the part where the temperature is high and where the amount of the crystals is large, the volume tends to shrink to pull the neighboring parts. On the other hand, in the part where the temperature is low and where the amount of the crystals is small, the number of the molecules to be caught by the crystals in the neighboring part increases while the molecular tension increases at the same time, and therefore the low-mobility fragment increases therein. The increase of the low-mobility fragment by the volume shrinkage can be attained by the shrinkage in the width direction (mono-dimensional shrinkage) but the shrinkage in both the width direction and the longitudinal direction (two-dimensional shrinkage) is more effective.

The "local temperature fluctuation" to be given is preferably from 0.3 to 6° C., more preferably from 0.5 to 4° C.

The "local temperature fluctuation" in the width direction may be given, for example, by changing the size of the outlet port of the hot air blow-off nozzle in the thermal fixation zone, or by ununiformly installing the heat source such as an IR heater or the like in the cross direction (for partly heating the film width but not wholly heating the entire width of the film), or by jetting out hot air partially having a low temperature, or by installing a shield plate of partially shielding the hot air or the heat source. When the "local temperature fluctuation" is not lower than the lowermost limit of the range defined in the invention, then the above-mentioned effect can be attained; and when not higher than the uppermost limit of the range defined in the invention, then it is favorable since $\Delta Cp$ does not overstep the uppermost limit of the range defined in the invention.

The "local temperature fluctuation" in the width direction may be given, for example, by changing the number of revolution of the hot air blow-off fan in the thermal fixation zone, or by changing the output of the heater generating the hot air. It is also preferable to place a heat-generator such as a IR heater and change the output thereof.

The low-mobility fragment is efficiently formed when both ends of the polyester molecule are taken in crystals, and therefore it is desirable that the molecular weight of the polyester resin in thermal fixation is high, or that is, IV of the resin is high in some degree and is within the range defined in the invention. Not adhering to any theory, it is expected that the molecules between crystals could be pulled through volume shrinkage in crystal formation to form the low-mobility fragment. When IV is not higher than the uppermost limit of the range defined in the invention, the melt viscosity of the resin melt does not increase too much and the resin melt can be well kneaded in melt casting film formation, and accordingly, the melt extrusion step is free from a trouble of unevenness in film formation. As a result, the formed film is advantageous in that the thermal shrinkage thereof increases little and the surface planarity thereof worsens little.

(2) Second Production Method—Wind Speed Fluctuation—

The polyester film of the invention of which $\Delta Cp$ is controlled to fall within the range defined in the invention is attained by giving a wind speed fluctuation of from 0.1 to 10% to the stretched film in the film width direction during thermal fixation of the film thereby forming the low-mobility fragment in the film. The "wind speed fluctuation" is as follows: In the thermal fixation zone, the film width is divided into ten equal parts, the wind speed in each part is measured, the wind speed difference between the adjacent parts is computed, and the data are averaged to give a mean value, which is the wind speed fluctuation.

When the wind speed fluctuation falls within the range, then a difference may be given to the amount of the crystals to be formed in the film. Specifically, of the part where the temperature is high and where the amount of the crystals is large, the volume tends to shrink to pull the neighboring parts. On the other hand, in the part where the temperature is low and where the amount of the crystals is small, the number of the molecules to be caught by the crystals in the neighboring part increases while the molecular tension increases at the same time, and therefore the low-mobility fragment increases therein. Not adhering to any theory, the film given a high wind speed is pulled and the molecular alignment and the crystallization go on therein to form a low-mobility fragment, and with that, the volume of the film of that part shrinks. On the other hand, the film given a low wind speed is oriented weakly, and while providing molecules to the high wind speed part to relax the volume shrinkage, the film part promotes the formation of a low-mobility fragment. When the wind speed fluctuation is not lower than the lowermost limit of the range defined in the invention, then the above effect is sufficient and the low-mobility fragment is easy to form. When not higher than the uppermost limit of the range, then the film surface planarity is not worsened by the wind speed fluctuation and the polyester film produced of the invention can have a good surface planarity.

The "wind speed fluctuation" to be given is preferably from 0.3 to 8%, more preferably from 0.5% to 6%.

The "wind speed fluctuation" may be given, for example, by changing the slit size of the nozzle from which hot air is blown into the thermal fixation zone in different sites. Most preferably, the wind speed fluctuation is given in the thermal fixation zone where crystals are formed.

Like the effect of the above-mentioned temperature fluctuation, preferably, the effect of the wind speed fluctuation is given to the polyester of which IV falls within the range defined in the production method of the invention, or that is, to the polyester having a relatively high IV.

More preferably, the effect of forming the low-mobility fragment by the wind speed fluctuation can be synergistically augmented when combined with the above-mentioned "local temperature fluctuation". Specifically, it is desirable that the embodiment of the first production method is combined with the embodiment of the second production method.

Preferably, the thermal fixation temperature (hereinafter this may be referred to as Tk) in the thermal fixation zone is higher than the glass transition temperature and lower than the melting point, more preferably from 195° C. to 230° C., still more preferably from 200° C. to 225° C., even more preferably from 205° C. to 220° C. Falling within the temperature range, the amount of the crystals to be formed through the thermal fixation may fall within the preferred range, and the level of the low-mobility fragment in the film of the invention may be readily satisfied, or that is, the film may readily attain the desired $\Delta Cp$.

Preferably, the thermal fixation is attained at the highest temperature among the heat treatment in the process after film formation. The temperature in the thermal fixation is the temperature of the film surface. For measuring the temperature of the film surface, a method of measuring it with an IR radiation thermometer, a method of measuring it with the film kept in contact with a thermocouple or the like may be selected.

Preferably, the time for the thermal fixation is from 1 second to 3 minutes, more preferably from 2 seconds to 40 seconds, even more preferably from 3 seconds to 30 seconds. Preferably, the above-mentioned heat treatment time is taken while the polyester film is given local temperature fluctuation or wind speed fluctuation, from the viewpoint that $\Delta Cp$ of the film can be readily controlled to fall within the defined range.

Also preferably, the film temperature during the thermal fixation is kept almost constant with no fluctuation while the film is kept given local temperature fluctuation or wind speed fluctuation during the above-mentioned heat treatment time. Concretely, while the film is kept given local temperature fluctuation or wind speed fluctuation during the above-mentioned heat treatment time, the film temperature fluctuation range is preferably from 0.1° C. to 10° C., more preferably from 0.3° C. to 6° C., even more preferably from 0.5° C. to 6° C.

Concretely, during the period of time while the film runs from the inlet port of the thermal fixation zone to the outlet port thereof, preferably, the film is kept running therethrough for the above-mentioned period of time at the thermal fixation temperature falling within the above-mentioned range while kept fixed in the film width direction and while kept given local temperature fluctuation or wind speed fluctuation falling within the above-mentioned range. The thermal fixation zone may communicate with or not with the thermal relaxation zone for relaxation treatment (this may be referred to as thermal relaxation treatment) to be mentioned below.

If desired and not contradictory to the scope and the sprit of the invention, the film may be or may not be relaxed in the cross direction or in the machine direction after the thermal fixation. Preferably, in the production method of the invention, the film is relaxed after the thermal fixation. In case where the film is relaxed after the thermal fixation, preferably, the degree of relaxation is from 1 to 30%, more preferably from 2 to 25%, even more preferably from 3 to 20%.

Preferably, the relaxation treatment is attained in the cross direction of the film (in the direction perpendicular to the film traveling direction, or that is, in the lateral direction of the film). The uppermost limit of the temperature in the relaxation treatment is preferably not higher than the above-mentioned thermal fixation temperature, and is more preferably lower than the thermal fixation temperature. The lowermost limit of the temperature in the relaxation treatment is preferably not lower than the above-mentioned thermal fixation temperature −40° C., more preferably not lower than the above-mentioned thermal fixation temperature −20° C.

(Heat Treatment)

Preferably, the polyester film production method of the invention includes a step of heat treatment at 100° C. to 200° C. for 0.5 to 10 minutes after the thermal fixation step. More preferably, the production method includes, after the thermal fixation step, a step of heat treatment at 100 to 200° C. for 0.5 to 10 minutes after the relaxation treatment.

The film of the invention has $\Delta Cp$ falling within the above range and therefore its surface planarity hardly worsens in heat treatment. Concretely, as described in the above section of the polyester film of the invention, the thermal shrinkage of the film of which $\Delta Cp$ falls within the range defined in the invention is retarded, and therefore in the production method of the invention, the dimensional change of the polyester film in the heat treatment step after the thermal fixation step is small and the surface planarity thereof is prevented from being worsened in the heat treatment step. Specifically, even when the film of the invention is heat-treated in the same manner as in a conventional known, weather-resistant polyester resin production method, the polyester film produced according to the production method of the invention can have good surface planarity.

$\Delta Cp$ does not change in the heat treatment in the production method of the invention, and therefore when the film is processed for thermal shrinkage treatment, $\Delta Cp$ of the film after the thermal shrinkage treatment is defined as $\Delta Cp$ of the polyester film of the invention. In the heat treatment step, linear expansion and thermal shrinkage occur simultaneously; however, when the thermal shrinkage is the lowermost limit of the preferred range of the polyester film of the invention, the two, linear expansion and thermal shrinkage are balanced out by each other and the dimensional change becomes approximately zero, and when the thermal shrinkage is lower than the range, then the film expands. The expansion brings about loosing of the film, and wrinkling thereof more than excessive shrinkage.

The heat treatment temperature to attain the thermal shrinkage reduction in the polyester film of the invention (hereinafter this may be referred to as Ts) is preferably lower than the temperature at the aforementioned thermal fixation step, more preferably from 100° C. to 200° C., still more preferably from 120° C. to 190° C., even more preferably from 130° C. to 180° C. The polyester film of the invention can be used as a backsheet to constitute a solar cell module, and in use of the module, the environmental temperature may rise up to 100° C. or so. Accordingly, the heat treatment temperature (Ts) is preferably not lower than 100° C.

Preferably, the heat treatment time is from 0.5 minutes to 10 minutes, more preferably from 1 minute to 8 minutes, even more preferably from 2 minutes to 6 minutes.

Preferably, the tension in the heat treatment is from 1 to 20 kg/m, more preferably from 2 to 15 kg/m, even more preferably from 3 to 12 kg/m. The tension is in terms of the value of the film having a thickness of 100 μm, and therefore, for example, for a film having a thickness of 200 µm, a tension of twice the above may be given thereto.

In the polyester film production method of the invention, the heat treatment step may be on-line or off-line; but preferably, the heat treatment step is off-line after the stretching step.

Preferably, the heat treatment (with or without drying) is effected subsequently to stretching, more preferably is effected on-line subsequently to longitudinal/lateral stretching. "On-line" operation means that the film is directly processed as such, not wound up. The on-line treatment prevents surface planarity degradation. This is because, when the film is once wound up, its free stretching under heat or with moisture absorption/desorption may be retarded owing to the friction in the roll, therefore bringing about residual strain to cause surface planarity failure.

The winding mode of the polyester film of the invention is not specifically defined. For example, the methods described in JP-A 2009-226824; JP-B 3-60301, 3-65778, 4-60424; JP-A 61-241127, 61-261026, 62-55900, 62-270327, 62-233228, 63-67558, 63-204577, 2-194924, 4-286564, 8-133537, 8-225199, 2000-177890, 2003-201047, 2003-266525, 2005-170613, 2007-70514, 2007-217129, 2010-36519 may be employed favorably.

In the production method of the invention, the mode of heat treatment is not specifically defined. For example, the film may be heat-treated in an independent blower-type heat treatment zone, of in case where the film is coated, the coated film may be dried along with heat treatment in a drying zone.

(Formation and Drying of Coating Layer)

Preferably, the polyester film production method of the invention includes a step of coating the polyester film to form a coating layer thereon and drying the coating layer in a drying zone after the thermal fixation step, in which the heat treatment of the film is attained in the drying zone, from the viewpoint of preventing the surface planarity reduction in the film.

This is because the coating layer absorbs the temperature fluctuation in the drying zone and the temperature fluctuation on the film surface may be thereby reduced. (In the thermal fixation zone, crystallization goes on and therefore ΔCp changes under the above-mentioned temperature fluctuation, but during heat treatment, crystallization does not go on but thermal shrinkage fluctuation alone goes on, and therefore the temperature fluctuation is preferably smaller.)

The coating layer may be formed on one surface or on both surfaces of the polyester film of the invention.

<Backsheet for Solar Cells>

The backsheet for solar cells of the invention contains the polyester film of the invention.

The backsheet for solar cells of the invention may comprise the polyester film of the invention and at least one functional layer formed thereon, in which the functional layer includes an easy adhesion layer that easily adheres to an adherend, an UV absorbent layer, a light-reflection white layer or the like. Since the backsheet contains the polyester film of the invention, it secures stable durability in long-term use.

The backsheet for solar cells of the invention may have the following functional layer formed by coating on the monoaxially and/or biaxially stretched polyester film. For the coating, employable is any known coating technique of a roll coating method, a knife edge coating method, a gravure coating method, a curtain coating method, etc.

Before the coating, the film may be processed for surface treatment (flame treatment, corona treatment, plasma treatment, UV treatment). Sticking the layer with an adhesive is also preferred.

—Easy Adhesion Layer—

In case where the polyester film of the invention is used to constitute a solar cell module, preferably, an easy adhesion layer is formed on the side of the film substrate of the solar cell element encapsulated with a sealant. Forming an easy adhesion layer exhibiting adhesiveness to the adherend that contains a sealant (especially ethylene-vinyl acetate copolymer), for example, to the surface of the sealant of the film substrate of the solar cell element encapsulated with the sealant solidly enhances the adhesion between the backsheet and the sealant. Concretely, the easy adhesion layer preferably has an adhesion force to EVA (ethylene-vinyl acetate copolymer) used as the sealant of at least 10 N/cm, more preferably at least 20 N/cm.

The easy adhesion layer must be enough to prevent the backsheet from peeling during use of the solar cell module, and therefore, the easy adhesion layer preferably has good heat resistance.

(1) Binder:

The easy adhesion layer in the invention may contain at least one binder.

As the binder, for example, usable are polyesters, polyurethanes, acrylic resins, polyolefins. Above all, preferred are acrylic resins and polyolefins from the viewpoint of the durability thereof. As the acrylic resin, also preferred is a composite resin of acryl and silicone. Preferred examples of the binder are mentioned below.

Examples of the polyolefins are Chemipearl S-120, S-75N (both by Mitsui Chemical. Examples of the acrylic resins are Jurymer ET-410, SEK-301 (both by Nippon Junyaku Kogyo). Examples of the composite resin of acryl and silicone are Ceranate WSA1060, WSA1070 (both by DIC), and H7620, H7630, H7650 (all by Asahi Kasei Chemicals).

The amount of the binder is preferably within a range of from 0.05 to 5 g/m$^2$, more preferably from 0.08 to 3 g/m$^2$. When the amount of the binder is at least 0.05 g/m$^2$, then the layer may have a good adhesion power; and when at most 5 g/m$^2$, then the film may have a good surface planarity.

(2) Fine Particles:

The easy adhesion layer in the invention may contain at least one type of fine particles. Preferably, the easy adhesion layer contains fine particles in an amount of at least 5% by mass of all the mass of the layer.

As the fine particles, preferred are inorganic fine particles of silica, calcium carbonate, magnesium oxide, magnesium carbonate, tin oxide, etc. Of those, more preferred are fine particles of tin oxide or silica from the viewpoint the reduction in the adhesiveness of the layer is small when exposed to wet heat environments.

Preferably, the particle size of the fine particles is from 10 to 700 nm or so, more preferably from 20 to 300 nm or so. Using the fine particles of which the particle size falls within the range, the layer secures good easy adhesiveness. The shape of the fine particles is not specifically defined. For example, the fine particles may be spherical, amorphous or acicular.

The amount of the fine particles to be in the easy adhesion layer is preferably from 5 to 400% by mass of the binder in the easy adhesion layer, more preferably from 50 to 300% by mass. When the amount of the fine particles is at least 5% by mass, then the layer secures good adhesiveness when exposed to wet heat environments; and when at most 400% by mass, then the surface planarity of the easy adhesion layer is better.

(3) Crosslinking Agent:

The easy adhesion layer in the invention may contain at least one crosslinking agent.

Examples of the crosslinking agent are epoxy-type, isocyanate-type, melamine-type, carbodiimide-type and oxazoline-type crosslinking agents. From the viewpoint of securing the adhesiveness after aged in wet heat environments, oxazoline-type crosslinking agents are preferred of these.

Examples of the oxazoline-type crosslinking agents are 2-vinyl-2-oxazoline, 2-vinyl-4-methyl-2-oxazoline, 2-vinyl-5-methyl-2-oxazoline, 2-isopropenyl-2-oxazoline, 2-isopropenyl-4-methyl-2-oxazoline, 2-isopropenyl-5-ethyl-2-oxazoline, 2,2'-bis(2-oxazoline), 2,2'-methylenebis(2-oxazoline), 2,2'-ethylenebis(2-oxazoline), 2,2'-trimethylenebis(2-oxazoline), 2,2'-tetramethylenebis(2-oxazoline), 2,2'-hexamethylenebis(2-oxazoline), 2,2'-octamethylenebis(2-oxazoline), 2,2'-ethylenebis(4,4'-dimethyl-2-oxazoline), 2,2'-p-phenylenebis(2-oxazoline), 2,2'-m-phenylenebis(2-oxazoline), 2,2'-m-phenylenebis(4,4'-dimethyl-2-oxazoline), bis(2-oxazolinylcyclohexane) sulfide, bis(2-oxazolinylnorbornane) sulfide, etc. (Co)polymers of these compounds are also preferred for use herein.

Compounds having an oxazoline group are also usable, such as Epocross K2010E, K2020E, K2030E, WS500, WS700 (all by Nippon Shokubai Kagaku Kogyo).

The amount of the crosslinking agent to be in the easy adhesion layer is preferably from 5 to 50% by mass of the binder in the layer, more preferably from 20 to 40% by mass. When the amount of the crosslinking agent is at least 5% by mass, then the agent secures a good crosslinking effect, not causing strength reduction or adhesion failure of reflection layer; and when at most 50% by mass, then the pot life of the coating liquid can be kept long.

(4) Additive:

If desired, a known mat agent such as polystyrene, polymethyl methacrylate or silica, and a known surfactant such as an anionic surfactant or a nonionic surfactant may be added to the easy adhesion layer in the invention.

(5) Method of Formation of Easy Adhesion Layer:

For forming the easy adhesion layer in the invention, there may be employed a method of sticking an adhesive polymer sheet to the polyester film of the invention, or a method of coating the polyester film with the sheet. The coating method is preferred as simple and as capable of forming a uniform and thin layer. For the coating method, for example, employable is any known method with a gravure coater or a bar coater. The solvent for the coating liquid may be water or may be an organic solvent such as toluene or methyl ethyl ketone. One or more different types of solvents may be used either singly or as combined.

In case where the easy adhesion layer is formed by coating, preferably the coating layer is dried and heat-treated in the drying zone after heat treatment, as so mentioned in the section of the production method of the invention. In case where the colorant layer and other functional layers to be mentioned below are formed by coating, the same shall apply thereto.

(6) Physical Properties:

Not specifically defined, the thickness of the easy adhesion layer in the invention is generally preferably from 0.05 to 8 µm, more preferably from 0.1 to 5 µm. When the thickness of the easy adhesion layer is at least 0.05 µm, the layer readily obtains the necessary adhesiveness; and when at most 8 µm, then the surface planarity of the film can be kept good.

Preferably, the easy adhesion layer in the invention is transparent from the viewpoint that when a colorant layer (especially reflection layer) is disposed between the polyester film and the easy adhesion layer, the layer does not detract from the effect of the colorant layer.

—UV Absorbent Layer—

The polyester film of the invention may have a UV absorbent layer containing the above-mentioned UV absorbent. The UV absorbent layer may be positioned in any site on the polyester film.

Preferably, the UV absorbent is dissolved or dispersed along with an ionomer resin, a polyester resin, an urethane resin, an acrylic resin, a polyethylene resin, a polypropylene resin, a polyamide resin, a vinyl acetate resin, a cellulose ester resin or the like; and preferably, the light transmittance at 400 nm or less of the UV absorbent layer is at most 20%.

—Colorant Layer—

The polyester film of the invention may have a colorant layer. The colorant layer is disposed on the polyester film directly in contact with the surface thereof or via any other layer therebetween, using a pigment and a binder.

The first function of the colorant layer is to reflect the part of the incident light not used for power generation in a solar cell but having reached the backsheet and to return it to the solar cell to thereby enhance the power generation efficiency of the solar cell module. The second function to improve the beauty of the outward decoration of a solar cell module when seen from its front. In general, when a solar cell module is seen from its front, the backsheet is seen around the solar cell, and by providing a colorant layer in the backsheet, the outward decoration of the solar cell module is improved.

(1) Pigment:

The colorant layer in the invention may contain at least one pigment. Preferably, the amount of the pigment in the layer is from 2.5 to 8.5 $g/m^2$, more preferably, from 4.5 to 7.5 $g/m^2$. When the amount of the pigment is at least 2.5 $g/m^2$, then the layer may readily obtain the desired coloration, and the light reflectivity and the designability of the layer may be bettered. When the amount of the pigment is at most 8.5 $g/m^2$, then the surface planarity of the colorant layer may be kept better.

The pigment includes, for example, inorganic pigments such as titanium oxide, barium sulfate, silicon oxide, aluminium oxide, magnesium oxide, calcium carbonate, kaolin, talc, ultramarine, prussian blue, carbon black; and organic pigments such as phthalocyanine blue, phthalocyanine green. Of those pigments, preferred are white pigments from the viewpoint of constituting the colorant layer as the reflection layer to reflect the incident sunlight thereinto. As the white pigments, for example, preferred are titanium oxide, barium sulfate, silicon oxide, aluminium oxide, magnesium oxide, calcium carbonate, kaolin, talc.

The mean particle size of the pigment is preferably from 0.03 to 0.8 µm, more preferably from 0.15 to 0.5 µm. When the mean particle size is out of the range, then the light reflection efficiency of the pigment may lower.

In case where the colorant layer serves as the reflection layer of reflecting sunlight, the preferred range of the amount of the pigment to be in the reflection layer could not be indiscriminately determined as varying depending on the type and the mean particle size of the pigment to be used, but is generally from 1.5 to 15 $g/m^2$, more preferably from 3 to 10 $g/m^2$ or so. When the amount is at least 1.5 $g/m^2$, then the necessary reflectivity is easy to attain; and when at most 15 $g/m^2$, then the strength of the reflection layer can be kept further higher.

(2) Binder:

The colorant layer in the invention may contain at least one binder. The amount of the binder, if any, is preferably within a range of from 15 to 200% by mass of the pigment, more preferably from 17 to 100% by mass. When the amount of the binder is at least 15% by mass, then the strength of the colorant layer may be kept further better; and when at most 200% by mass, then the reflectivity and the designability may higher.

As the binder favorable for the colorant layer, for example, there may be mentioned polyesters, polyurethanes, acrylic resins, polyolefins. From the viewpoint of the durability of the film, acrylic resins and polyolefins are preferred for the binder. As the acrylic resin, also preferred is a composite resin of acrylic and silicone. Preferred examples of the binder are mentioned below.

Examples of the polyolefins are Chemipearl S-120, S-75N (both by Mitsui Chemical). Examples of the acrylic resins are Jurymer ET-410, SEK-301 (both by Nippon Junyaku Kogyo). Examples of the composite resin of acryl and silicone are Ceranate WSA1060, WSA1070 (both by DIC), and H7620, H7630, H7650 (all by Asahi Kasei Chemicals).

(3) Additive:

In addition to the binder and the pigment, if desired, a crosslinking agent, a surfactant, a filler and the like may be added to the colorant layer in the invention.

Examples of the crosslinking agent are epoxy-type, isocyanate-type, melamine-type, carbodiimide-type and oxazoline-type crosslinking agents. The amount of the crosslinking agent in the colorant layer is preferably from 5 to 50% by mass of the binder in the layer, more preferably from 10 to 40% by mass. When the amount of the crosslinking agent is at least 5% by mass, then the agent secures a good crosslinking effect and is therefore effective for enhancing the strength and the adhesiveness of the colorant layer; and when at most 50% by mass, then the pot life of the coating liquid can be kept long.

As the surfactant, herein usable are known surfactants such as anionic surfactants and nonionic surfactants. The amount of the surfactant is preferably from 0.1 to 15 mg/m$^2$, more preferably from 0.5 to 5 mg/m$^2$. When the amount of the surfactant is at least 0.1 mg/m$^2$, then the coating layer may be effectively prevented from being repelled; and when at most 15 mg/m$^2$, then the adhesiveness of the layer is good.

Apart from the above-mentioned pigment, a filler such as silica or the like may be added to the colorant layer. The amount of the filler is preferably at most 20% by mass of the binder in the colorant layer, more preferably at most 15% by mass. Containing a filler, the strength of the colorant layer may be enhanced, and when the amount of the filler is at most 20% by mass, then the pigment ratio can be kept suitable therefore providing good light reflection (reflectivity) and designability.

(4) Method of Formation of Colorant Layer:

For forming the colorant layer, there may be mentioned a method of sticking a pigment-containing polymer sheet to the polyester film, a method of co-extruding the colorant layer in polyester film formation, and a method of forming the layer by coating. Of those, the coating method is preferred as simple and as capable of forming a uniform and thin layer. For the coating method, for example, employable is any known method with a gravure coater or a bar coater. The solvent for the coating liquid may be water or may be an organic solvent such as toluene or methyl ethyl ketone. From the viewpoint of environmental load, water is preferred for the solvent.

One or more different types of solvents may be used either singly or as combined.

(5) Physical Properties:

Preferably, the colorant layer is a white layer (light reflection layer) containing a white pigment. The light reflectivity at 550 nm of the reflection layer is preferably at least 75%. When the reflectivity is at least 75%, then the sunlight not used for power generation as having passed through the solar cell can be returned back to the cell and therefore the layer can more effectively increase the powder generation efficiency.

Preferably, the thickness of the white layer (light reflection layer) is from 1 to 20 µm, more preferably from 1 to 10 µm, even more preferably from 1.5 to 10 µm or so. When the thickness is at least 1 µm, then the necessary designability and reflectivity are easy to attain; and when at most 20 µm, the surface planarity of the film may be improved.

—Undercoat Layer—

An undercoat layer may be provided in the polyester film of the invention. The undercoat layer may be between the colorant layer, if any, and the polyester film. The undercoat layer may be formed of a binder, a crosslinking agent, a surfactant, etc.

The binder in the undercoat layer may be selected from polyesters, polyurethanes, acrylic resins, polyolefins. Apart from the binder, the undercoat layer may contain a crosslinking agent selected from epoxy-type, isocyanate-type, melamine-type, carbodiimide-type and oxazoline-type crosslinking agents, a surfactant selected from anionic and nonionic surfactants, and a filler such as silica.

The coating method for the undercoat layer and the solvent for the coating liquid are not specifically defined.

For example, in the coating method, a gravure coater or a bar coater may be used. The solvent may be water or an organic solvent such as toluene or methyl ethyl ketone. One or more such solvents may be used either singly or as combined.

The coating liquid may be applied onto the polyester film after biaxially stretched or after monoaxially stretched. In this case, after coated, the film may be further stretched in the direction different from that in which the film has been stretched previously. After the unstretched polyester film is coated, it may be stretched in two directions.

The thickness of the undercoat layer is preferably from 0.05µ to 2 µm, more preferably from 0.1 µm to 1.5 µm or so. When the thickness is at least 0.05 µm, then the layer may readily have the necessary adhesiveness; and when at most 2 µm, then the surface planarity of the film may be kept good.

—Fluororesin Layer, Silicon Resin Layer—

Preferably, at least one of a fluororesin and a silicon (Si) resin layer is provided in the polyester film of the invention. Having a fluororesin and an Si resin layer, the surface of the polyester film may be prevented from being soiled and the weather resistance of the film may be enhanced. Concretely, the fluororesin coating layer as in JP-A 2007-35694, 2008-28294 and WO2007/063698 is preferred in the film of the invention.

Also preferably, a fluororesin film such as Tedlar (by DuPont) may be stuck to the film of the invention.

The thickness of the fluororesin layer and the Si resin layer is preferably within a range of from 1 µm to 50 µm each, more preferably from 1 µm to 40 µm, even more preferably from 1 µm to 10 µm.

—Inorganic Layer—

Also preferably, an inorganic layer may be provided in the polyester film of the invention. Having an inorganic layer, the polyester film may be given a moisture-proof and gas-barrier function of preventing moisture and vapor penetration thereinto. The inorganic layer may be formed on the surface or the back of the polyester film; but from the viewpoint of the waterproofness and moisture-proofness of the film, the inorganic layer is preferably formed on the side opposite to the side of the polyester film that faces the cell substrate (that is, on the side opposite to the side of the film on which the colorant layer and the easy adhesion layer are formed).

The water vapor permeation (moisture permeation) of the inorganic layer is preferably from $10^0$ g/m$^2$·d to $10^{-6}$ g/m$^2$·d, more preferably from $10^{-1}$ g/m²·d to $10^{-5}$ g/m²·d, even more preferably from $10^{-2}$ g/m²·d to $10^{-4}$ g/m²·d.

For forming the inorganic layer having the moisture permeation as above, the following dry method is preferred.

As the dry method of forming the gas-barrier inorganic layer (hereinafter this may be referred to as gas-barrier layer), there may be mentioned a physical vapor deposition method (PVD method) such as a vacuum deposition method of resistance heating evaporation, electron beam evaporation, induction heating evaporation, or plasma or ion beam-assisted vapor evaporation, or a sputtering method of reactive sputtering, ion beam sputtering or ECR (electron cyclotron) sputtering, as well as a chemical vapor deposition (CVD) method with heat, light, plasma or the like. Above all, preferred is a vacuum deposition method of film formation in vacuum through deposition.

In case where the material to form the gas-barrier layer comprises, as the main constitutive ingredient, an inorganic oxide, an inorganic nitride, an inorganic oxynitride, an inorganic halide, an inorganic sulfide or the like, the material having the same composition as that of the gas-barrier layer to be formed may be directly evaporated and deposited; however, in this method, the composition may change during evaporation and, as a result, the formed film could not exhibit uniform properties. Accordingly, for solving the problem, there may be employed 1) a method where a material having the same composition as that of the barrier layer is used as the evaporation source, and the source is evaporated while an oxygen gas is supplementarily introduced into the system for an inorganic oxide, a nitrogen gas is thereinto for an inorganic oxide, a mixed gas of oxygen gas and nitrogen gas is for an inorganic oxynitride, a halogen-based gas is for an inorganic halide, and a sulfur-based gas is for an inorganic sulfide; 2) a method where an inorganic material group is used as the evaporation source, and while this is evaporated, an oxygen gas is supplementarily introduced into the system for an inorganic oxide, a nitrogen gas is thereinto for an inorganic oxide, a mixed gas of oxygen gas and nitrogen gas is for an inorganic oxynitride, a halogen-based gas is for an inorganic halide, and a sulfur-based gas is for an inorganic sulfide, and the inorganic material is reacted with the thus-introduced gas for deposition on the surface of the substrate; 3) a method where an inorganic material group is used as the evaporation source and this is evaporated to form a layer of the inorganic material group, and the inorganic oxide is kept in an oxygen gas atmosphere, the inorganic nitride is in a nitrogen gas atmosphere, the inorganic oxynitride is in a mixed gas atmosphere of oxygen gas and nitrogen gas, the inorganic halide is in a halogen-based gas atmosphere and the inorganic sulfide is in a sulfur-based gas atmosphere whereby the inorganic material layer is reacted with the thus-introduced gas.

Of those, preferred is the method 2) or 3) as the evaporation source is easy to evaporate. More preferred is the method 2) as the film quality is easy to control. In case where an barrier layer of an inorganic oxide is formed, also preferred is a method where an inorganic material group is used as the evaporation source, and this is evaporated to form a layer of the inorganic material, and thereafter this is left in air for spontaneous oxidation of the inorganic material therein. According to the method, the layer is easy to form.

Also preferably, an aluminium foil may be stuck to the film to form a barrier layer thereon. Its thickness is preferably from 1 μm to 30 μm. When the thickness is at least 1 μm, then water may hardly penetrate into the polyester film in aging (thermo-aging) and the film is hardly hydrolyzed; and when at most 30 μm, then the barrier layer is not too thick and the film is not deformed by the stress of the barrier layer.

<Solar Cell Module>

The solar cell module of the invention contains the polyester film of the invention.

The solar cell module of the invention comprises a solar cell element for converting the light energy of sunlight to electric energy, as sandwiched between a transparent substrate to which sunlight is applied and the polyester film of the invention (solar cell backsheet) described hereinabove. The gap between the substrate and the polyester film may be sealed up with a resin such as an ethylene-vinyl acetate copolymer or the like (sealant).

The other members than the backsheet of solar cell modules and solar cells are described, for example, in "Solar Power System Constitutive Materials" (by Eiichi Sugimoto, Kogyo Chosakai Publishing, 2008).

The transparent substrate may be any one having a light transmittance for sunlight transmission therethrough, and may be suitably selected from light-transmitting substrates. From the viewpoint of the power generation efficiency, those having a higher light transmittance are preferred, and more preferred are glass substrates and transparent resins such as acrylic resins.

As the solar cell element, various known solar cell elements are employable here, including, for example, silicon-based elements of single-crystal silicon, polycrystal silicon, amorphous silicon or the like, as well as III-V Group or II-VI Group compound semiconductor elements of copper-indium-gallium-selenium, copper-indium-selenium, cadmium-tellurium, gallium-arsenic or the like.

EXAMPLES

The characteristics of the invention are described more concretely with reference to Examples given below.

In the following Examples, the material used, its amount and ratio, the details of the treatment and the treatment process may be suitably modified or changed not overstepping the sprit and the scope of the invention. Accordingly, the invention should not be limitatively interpreted by the Examples mentioned below.

Unless otherwise specifically indicated, "part" is by mass.
(Mensuration)
(1) AV (Terminal COOH Content)

A sample of the film was completely dissolved in a mixed solution of benzyl alcohol/chloroform (=⅔, by volume), and using phenol red as an indicator, this was titered with a standard solution (0.025 N KOH/methanol mixed solution), and from the titration data, the terminal carboxyl group amount (=terminal COOH content, eq/ton) was computed.
(2) IV A sample of the film was dissolved in a mixed solvent of 1,1,2,2-tetrachloroethane/phenol (=⅔ by mass), and the solution viscosity at 30° C. in the solvent was measured to be IV.
(3) Thermal Shrinkage:

The film was sampled in a rectangular size of 5 cm×15 cm. Those cut into 3 in such a manner that the 15-cm side could be parallel to MD (machine direction, or that is, film-traveling direction) were MD samples; and those cut into 3 in such a manner that the 15-cm side could be parallel to TD (transverse direction, or that is, direction perpendicular to the film-traveling direction) were TD samples. These samples were cut in the point at which the weaving width was divided into 5 equal parts; and thus, 15 MD samples in all and 15 TD samples in all were prepared.

Each sample was conditioned at 25° C. and at a relative humidity of 60% for at least 3 hours, a pair of holes spaced from each other by 10 cm were formed therein, and the length between the holes was measured with a pin gauge (this is L1).

Each sample was heat-treated under no tension in a thermostatic air bath at 150° C. for 30 minutes. Subsequently, the sample was conditioned at 25° C. and at a relative humidity of 60% for at least 3 hours, and the length between the holes was measured with a pin gauge (this is L2).

100×(L1×L2)/L1 was computed to be the thermal shrinkage (%) of each sample. The mean value of all MD and TD samples is shown in Tables 1 to 3 as "thermal shrinkage".

(4) ΔCp

ΔCp was measured according to the following M-DSC mensuration method.

From 5 to 10 mg of a sample of the film was put into an Al pan, and while heated from −20° C. up to 200° C. at 3° C./min in $N_2$, this was given modulation at an amplitude of 1° C. and at a frequency of 60 Hz.

The thermogram of the reversible fragment was taken out, and the data were plotted on a graph in which the specific heat was differentiated with respect to the temperature on the vertical axis (dCp/dT) and the temperature was taken on the horizontal axis. In the graph, the maximum value is Tg'.

The thermogram of the reversible fragment was taken out, and the data were plotted on a graph in which the specific heat (J/g·° C.) was taken on the vertical axis and the temperature (° C.) was on the horizontal axis. Based on the base line of the specific heat from 50 to 60° C., the data were extrapolated in the graph. The difference between the extrapolation line and the specific heat at Tg' is ΔCp.

In case where Tg' appears from Tg+5° C. to Tg+50° C., ΔCp is measured. Tg means the glass transition temperature (unit: ° C.) of the resin sample measured according to the following method.

Measurement of Tg:

From 5 to 10 mg of the sample was put in an Al pan, heated up to 300° C. at 5° C./min in $N_2$, and then rapidly cooled in liquid $N_2$. While heated from −20° C. up to 200° C. at 3° C./min in $N_2$, this was given modulation at an amplitude of 1° C. and at a frequency of 60 Hz and analyzed under the condition. Like in the above, the thermogram of the reversible fragment was taken out, and the data were plotted on a graph in which the specific heat was differentiated with respect to the temperature on the vertical axis (dCp/dT) and the temperature was taken on the horizontal axis. In the graph, the maximum value is Tg.

(5) Weatherability Time

Each PET film was thermo-treated at 120° C. and at a relative humidity of 100% for 10 to 300 hours at intervals of 10 hours. The elongation at break of the thermo-treated sample was measured, and the measured value was divided by the elongation at break of the sample before the thermotreatment to give the retention of elongation at break of the sample at each thermotreatment time, according to the formula mentioned below. The data were plotted on a graph in which the horizontal axis indicates the thermotreatment time and the vertical axis indicates the retention of elongation at break. The plotted dots were connected, and the time for the thermotreatment to keep the retention of elongation at break of at least 50% was read on the resulting curve (weatherability time). The weatherability time was measured for the sample before the thermal shrinkage treatment, and the data are shown in Tables 1 to 3 as the weatherability retention time "before thermal shrinkage treatment".

The sample processed for thermal shrinkage was analyzed in the same manner to determine the weatherability time for it, and this is the weatherability retention time "after thermal shrinkage treatment".

The value of the weatherability retention time after thermal shrinkage treatment was subtracted from the value of the weatherability retention time before thermal shrinkage treatment, and this is the weatherability retention time of "before thermal shrinkage treatment—after thermal shrinkage treatment". The data are shown in Tables 1 to 3.

One preferred characteristic of the film of the invention is that even after "thermal shrinkage treatment" for reducing thermal shrinkage of the film, the weatherability of the film is not worsened. Accordingly, it is desirable that the difference between "weatherability time before thermal shrinkage treatment" and "weatherability time after thermal shrinkage treatment" of the film of the invention is smaller. Specifically, in other words, it is desirable that the difference between the weatherability time "with thermal shrinkage treatment" and that "without thermal shrinkage" of the film of the invention is smaller.

(6) Haze:

Using Nippon Denshoku Kogyo's NDH2000 Haze Meter, the haze of the film was measured according to JIS-K-6714.

(7) Surface Condition

The film was sampled to a length of 1 m over the entire width thereof. The resulting sample was put on a horizontal bed and visually checked to count the number of the waves of the corrugated surface thereof.

Examples 1 to 94, Comparative Examples 1 to 10

(1) Formation of Weather-Resistant Polyester Film (1-1) Preparation of Polyester Resin
(a) Esterification Reaction
i) Preparation of Polyester Resin with Ti Catalyst Using a Ti catalyst, a polyester resin was prepared through polymerization according to the method mentioned below. In Examples and Comparative Examples, the polyester resins prepared through polymerization using a Ti catalyst are given Ti in the column of "Esterification Catalyst" in Table 1 and Table 2 below.

4.7 tons of high-purity terephthalic acid and 1.8 tons of ethylene glycol were mixed to prepare a slurry, taking 90 minutes, and this was continuously fed into a first esterification reactor at a flow rate of 3800 kg/hr. Further, an ethylene glycol solution of citrate chelate titanium complex with citric acid coordinated with Ti (VERTEC AC-420, by Johnson Massey) was continuously fed into the reactor in which the reactants were reacted with stirring at an inner temperature of 250° C. for a mean residence time of about 4.3 hours. In this, the citrate chelate titanium complex was continuously added so that its content could be 9 ppm in terms of Ti element. In this, the acid value of the obtained oligomer was 600 eq/ton.

The reaction product was transferred into a second esterification reactor, and with stirring, this was reacted at an inner temperature of 250° C. for a mean residence time of 1.2 hours thereby giving an oligomer having an acid value of 200 eq/ton. The second esterification reactor was partitioned into 3 zones inside it. An ethylene glycol solution of magnesium acetate was continuously fed into the second zone in such a manner that its amount could be 75 ppm in terms of the Mg element, and an ethylene glycol solution of trimethyl phosphate was into the third zone in such a manner that its amount could be 65 ppm in terms of the P element.

The esterification product obtained in the above was fed into a first polycondensation tank, and with stirring, this was polycondensed at a reaction temperature of 270° C. and under an inner pressure of $2.67 \times 10^{-3}$ MPa (20 Torr) for a mean retention time of about 1.8 hours.

Subsequently, this was transferred into a second polycondensation tank, in which with stirring, this was reacted (polycondensed) at an inner temperature of 276° C. and under an inner pressure of 6.67×10⁻⁴ MPa (5 Torr) for a mean retention time of about 1.2 hours.

Next, this was transferred into a third polycondensation tank, in which this was reacted (polycondensed) at an inner temperature of 278° C. and under an inner pressure of 2.0×10⁻⁴ MPa (1.5 Torr) for a mean retention time of about 1.5 hours to give a reaction product (polyethylene terephthalate (Ti)).

ii) Preparation of Polyester Resin with Sb Catalyst

Using an Sb catalyst, a polyester resin was prepared through polymerization according to the method mentioned below. In Examples and Comparative Examples, the polyester resins prepared through polymerization using an Sb catalyst are given Sb in the column of "Esterification Catalyst" in Tables 1 to 3 below.

According to the method mentioned below and expanded to a 10 ton/batch scale, a PET sample was prepared. Concretely, 64 parts of ethylene glycol was mixed with 100 parts of dimethyl terephthalate, and as a catalyst, 0.1 parts of zinc acetate and 0.03 parts of antimony trioxide were added thereto to attain interesterification at an ethylene glycol reflux temperature. 0.08 parts of trimethyl phosphate was added thereto, and with gradually heating and reducing the pressure, this was reacted for polymerization at 271° C. for 5 hours to give polyethylene terephthalate. The produced polyethylene terephthalate was cut into chips each having a length of 4 mm, and the chips were put in a rotary vacuum unit (rotary vacuum drier) conditioned at a temperature of 220° C. and a vacuum degree of 0.5 mmHg, and heated therein with stirring for 20 hours to give polyethylene terephthalate(Sb).

iii) Preparation of Polyester Resin with Al Catalyst

Using an Al catalyst, a polyester resin was prepared through polymerization according to the method mentioned below. In Examples and Comparative Examples, the polyester resins prepared through polymerization using an Al catalyst are given Al in the column of "Esterification Catalyst" in Table 1 and Table 2 below.

According to the method mentioned below, a PET sample was prepared. Concretely, high-purity terephthalic acid, and ethylene glycol and trimethylamine each in an amount of 2 molar times the acid to be 0.3 mol % of the acid component were put into a heat carrier-circulating, 2-liter stainless-made autoclave equipped with a stirrer, and esterified for 120 minutes under pressure of 0.25 MPa at 245° C. with removing the formed water out of the system through evaporation, thereby giving an oligomer mixture. A polycondensation catalyst of an aqueous solution of basic aluminium acetate (by Aldrich) and ethylene glycol was added to the oligomer mixture under reflux and, as a result, an ethylene glycol solution of 15 g/liter basic aluminium acetate was added to the mixture in an amount of 0.014 mol % in terms of the aluminium atom relative to the acid component of the polyester, and as a phosphorus compound, an ethylene glycol solution of 10 g/liter Irganox 1425 (by Ciba Speciality Chemicals) was thereto in an amount of 0.02 mol % in terms of Irganox 1425 relative to the acid component. Next, in a nitrogen atmosphere, this was stirred under normal pressure at 245° C. for 10 minutes. Subsequently, this was heated up to 275° C., taking 60 minutes, and the pressure of the reaction system was gradually lowered to be 13.3 Pa (0.1 Torr), and at 275° C. and under 13.3 Pa, this was reacted for polycondensation to have the desired IV. At the time when the system reached the predetermined stirring torque, nitrogen was introduced into the autoclave to restore the normal pressure, thereby stopping the polycondensation.

iv) Addition of "Trifunctional or More Polyfunctional Constitutive Ingredient"

In the polymerization step with the above-mentioned Sb catalyst, a trifunctional or more polyfunctional constitutive ingredient selected from the following was added in the amount indicated in Table 3 below, in addition to the dicarboxylic acid component and the diol component in the starting material composition. The additive amount as referred to herein is in terms of mol % relative to the total of the dicarboxylic acid component and the diol component.

Trifunctional carboxylic acid compound: trimellitic acid (TMA in Table 3)

Tetrafunctional carboxylic acid compound: benzenetetracarboxylic acid (BTC in Table 3)

Pentafunctional carboxylic acid compound: ethanepentacarboxylic acid (EPC in Table 3)

Hexafunctional carboxylic acid compound: cyclohexanehexacarboxylic acid (CHC in Table 3)

Trifunctional hydroxyl compound: trihydroxybenzene (THB in Table 3)

Tetrafunctional hydroxyl compound: pentaerythritol (PE in Table 3)

(b) Polycondensation—Solid Phase Polymerization—

The polymerized resin was pelletized, and crystallized at 140° C. for 10 minutes. After dried at 170° C. for 3 hours, this was polymerized in a mode of solid-phase polymerization at the temperature and for the period of time shown in Tables 1 to 3, thereby giving resins differing in AV and IV. The crystallization, the drying and the solid-phase polymerization were all attained in a nitrogen current atmosphere. However, in Examples 56 to 60, the solid-phase polymerization was attained in a nitrogen current atmosphere in which ethylene glycol (EG) vapor was introduced in a varying amount as mentioned below, thereby giving resins with varying AV.

|  | Amount of EG |
|---|---|
| Example 56 | 900 ppm |
| Example 57 | 700 ppm |
| Example 58 | 250 ppm |
| Example 59 | 40 ppm |
| Example 60 | 0 ppm |

In Examples 62 to 65 and 88 to 94, the above method was repeated with addition of EG shown in Table 1 and a solid-phase polymerization was conducted.

(1-2) Formation of Weather-Resistant Polyester Film

The resin prepared through solid phase polymerization was again dried, and in Examples 61 to 80 and Comparative Example 10, a terminal blocking agent was selected from the following and added in the amount indicated in Table 3 below. The additive amount is in terms of % by mass relative to the polyester resin.

(a) Carbodiimide compound: Rhein Chemie's Stabaxol P100 (Cl in Table)

(b) Epoxy compound: Hexion Speciality Chemicals' Cardura E10P (EP in Table)

(c) Oxazoline compound: Nippon Shokubai's Epocross RPS-1005 (OX in Table)

The resin prepared through solid-phase polymerization was again dried, put into an extruder, and in a nitrogen current atmosphere, this was melt-kneaded in a double-screw extruder at 280° C. The melt was extruded out onto a chill roll via a gear pump, a filter and a die. The IV decrease after the film formation (Δ IV, the difference in IV between before and after the film formation) was only 0.03 according to the invention using the double-screw extruder, whereas the IV decrease was 0.19 with use of the single-screw extruder.

In Examples 48 to 52, calcium phosphate was added to the system in an amount of 50, 100, 150, 200 or 250 ppm (in terms of Ca content, or that is, the ratio by weight of Ca in PET), thereby controlling the haze of the resulting film as in Tables 1 to 3.

To the chill roll, static electricity was imparted, and the roll was cooled by circulating a coolant (having a temperature of 10° C.) therein. The melt was solidified on the chill roll, and then peeled to give an unstretched film.

(1-3) Stretching and Thermal Fixation

The unstretched film was introduced into a tenter, and stretched therein in the machine direction to the draw ratio as in Tables 1 to 3 at a stretching temperature of 90° C., and then stretched in the lateral direction at a stretching temperature of 105° C.

Subsequently, the both sides in the width direction of the film were clipped with a tenter and while the distance of the width was kept, the film was thermally fixed for 20 seconds at the thermal fixation temperature Tk shown in Tables 1 to 3, and then relaxed by 3% in the width direction at a temperature lower by 5° C. than the thermal fixation temperature. In this, a wind speed fluctuation or a local temperature fluctuation as in Tables 1 to 3 was given to the film by changing the distance between the hot air blow-off nozzles or changing the hot air temperature in the film width direction. The temperature fluctuation in the longitudinal direction was given to the film by changing the number of revolution of the hot art fan.

(1-4) Heat Treatment

The film taken out of the tenter was heat-treated as follows. The selected mode for the heat treatment is shown in Tables 1 to 3. The heat treatment temperature Ts, the time and the tension (in terms of the film having a thickness of 100 mμ and a width of 1 m) in each mode are shown in Tables 1 to 3.

i) Heat Treatment Alone (this is "Heat Treatment Alone" in Tables 1 to 3)

Tendency drive pass rolls (capable of securing low-tension transport by reducing the friction in transportation through motor driving) were disposed in an aeration heat-treatment zone, and the film was transferred between the rolls.

ii) Heat Treatment Combined with Coating ("Heat Treatment Combined with Coating" in Tables 1 to 3)

Both surfaces of the polyester film were processed for corona discharge treatment, then the following "easy adhesion layer" was formed by coating on one surface thereof, and the film was dried at 120° C. for 3 minutes. Subsequently, the following "white layer" was formed by coating on the opposite surface, and the film was then heat-treated in the drying zone under the condition shown in Tables 1 to 3, in which the coating layer was dried.

"Easy Adhesion layer"

The following ingredients were mixed to prepare a coating liquid for easy adhesion layer, and this was applied onto the reflection layer so that the coated binder amount could be 0.09 g/m². Subsequently, this was dried at 180° C. for 1 minute to form an easy adhesion layer.

<Composition of Coating Liquid for Easy Adhesion Layer>

| | |
|---|---|
| Aqueous dispersion of polyolefin resin (binder: Chemipearl S75N by Mitsui Chemical, having a solid content of 24% by mass) | 5.2 parts |
| Polyoxyalkylene alkyl ether (Naroacty CL95 by Sanyo Chemical Industry, having a solid content of 1% by mass) | 7.8 parts |
| Oxazoline compound (Epocross WS-700 by Nippon Shokubai, having a solid content of 25% by mass) | 0.8 parts |
| Aqueous dispersion of silica fine particles (Aerosil OX-50 by Nippon Aerosil, having a solid content of 10% by mass) | 2.9 parts |
| Distilled water "White Layer (reflection layer, colorant layer)" | 83.3 parts |

First, the following ingredients were mixed, and then dispersed with a Dynomill disperser for 1 hour to prepare a pigment dispersion.

<Formulation of Pigment Dispersion>

| | |
|---|---|
| Titanium dioxide (Taipake R-780-2 by Ishihara Sangyo, having a solid content of 100%) | 39.9 parts |
| Polyvinyl alcohol (PVA-105 by Kuraray, having a solid content of 10%) | 8.0 parts |
| Surfactant (Demol EP by Kao, having a solid content of 25%) | 0.5 parts |
| Distilled water | 51.6 parts |

Next, the prepared pigment dispersion was mixed with the following ingredients to prepare a coating liquid for white layer.

<Formulation of Coating Liquid for White Layer>

| | |
|---|---|
| Above-mentioned pigment dispersion | 71.4 parts |
| Aqueous dispersion of polyacrylic resin (binder: Jurymer ET-410 by Nippon Junyaku Kogyo, having a solid content of 30% by mass) | 17.1 parts |
| Polyoxyalkylene alkyl ether (Nanoacty CL95 by Sanyo Chemical Industry, having a solid content of 1% by mass) | 2.7 parts |
| Oxazoline compound (crosslinking agent, Epocross WS-700 by Nippon Shokubai, having a solid content of 25% by mass) | 1.8 parts |
| Distilled water | 7.0 parts |

Using a bar coater, the coating liquid for white layer prepared as above was applied onto a sample of the film and dried at 180° C. for 1 minute to form thereon a white layer (reflection layer) in which the amount of the coated titanium dioxide was 6.5 g/m².

Regarding the mode of heat treatment, the off-line operation is such that the film taken out of the tenter is once wound up into a roll according to the mode mentioned below, and then this is unrolled and processed for heat treatment. The on-line operation is such that the film taken out of the tenter is successively processed for heat treatment and then wound up for the first time. The heat treatment mode is shown in Tables 1 to 3.

(1-5) Winding

After taken out of the tenter, the film was trimmed on both sides by 15 cm each, and then knurled to finish a film having a width of 1.5 m and a length of 3000 m. The thickness of the thus-produced film is shown in Tables 1 to 3. The thickness of the solidified but unstretched film was approximately from 10 to 15 times the thickness of the film shown in Tables 1 to 3

(that is, as computed by multiplying the thickness by the areal draw ratio shown in Tables 1 to 3).

(2) Evaluation of Formed Film

The formed and heat-treated film was evaluated according to the methods mentioned above, and the results are shown in Tables 1 to 3. In measuring ΔCp, IV and AV of the film that had been heat-treated in a mode of "heat treatment combined with coating", both surfaces of the polyester film coated with the coating layer were cut off with a razor, and the polyester film alone was analyzed. In the Tables 1 to 3, ΔIV denotes the difference in IV between before and after the film formation.

For measuring the haze thereof, the sample of the film just after formation (and not before coating and heat treatment) was analyzed.

The films of Comparative Examples 7 and 8 are the film of Example 1 in JP-A 2003-211538 and the film of Example 1 in JP-A 2007-150084, respectively. Examples 53 and 54 were modified from Comparative Examples 7 and 8 so as to satisfy the condition of the production method of the present invention. The film of Comparative Example 9 is Toray's X10S having a thickness of 188 μm, which was used as a weather-resistant polyester film in Example 1 in JP-A 2008-130642; and Example 55 was modified from Comparative Example 9 so as to satisfy the condition of the production method of the present invention.

TABLE 1

Polyester Film Production Method

| | | EG | Solid-Phase Polymerization | | | | Draw Ratio in Stretching | | Thermal Fixation | | |
| | Esterification Catalyst | Amount in Resin (ppm) | temperature ((C.) | time (hr) | IV of Resin (dL/g) | Extruder | lateral/ longitudinal | areal draw ratio | local temperature unevenness (° C.) | wind speed unevenness (%) | temperature Tk (° C.) |
|---|---|---|---|---|---|---|---|---|---|---|---|
| Comparative Example 1 | Ti | — | 210 | 25 | 0.84 | double | 1.09 | 12.6 | 0 | 0 | 210 |
| Example 1 | Ti | — | 210 | 25 | 0.84 | double | 1.09 | 12.6 | 0.1 | 0 | 210 |
| Example 2 | Ti | — | 210 | 25 | 0.84 | double | 1.09 | 12.6 | 0.3 | 0 | 210 |
| Example 3 | Ti | — | 210 | 25 | 0.84 | double | 1.09 | 12.6 | 1.5 | 0 | 210 |
| Example 4 | Ti | — | 210 | 25 | 0.84 | double | 1.09 | 12.6 | 6 | 0 | 210 |
| Example 5 | Ti | — | 210 | 25 | 0.84 | double | 1.09 | 12.6 | 10 | 0 | 210 |
| Comparative Example 2 | Ti | — | 210 | 25 | 0.84 | double | 1.09 | 12.6 | 11 | 0 | 210 |
| Comparative Example 3 | Ti | — | 210 | 25 | 0.84 | double | 1.11 | 13.7 | 0 | 0 | 215 |
| Example 6 | Ti | — | 210 | 25 | 0.84 | double | 1.11 | 13.7 | 0 | 0.1 | 215 |
| Example 7 | Ti | — | 210 | 25 | 0.84 | double | 1.11 | 13.7 | 0 | 0.3 | 215 |
| Example 8 | Ti | — | 210 | 25 | 0.84 | double | 1.11 | 13.7 | 0 | 3 | 215 |
| Example 9 | Ti | — | 210 | 25 | 0.84 | double | 1.11 | 13.7 | 0 | 8 | 215 |
| Example 10 | Ti | — | 210 | 25 | 0.84 | double | 1.11 | 13.7 | 0 | 10 | 215 |
| Comparative Example 4 | Ti | — | 210 | 25 | 0.84 | double | 1.11 | 13.7 | 0 | 11 | 215 |
| Example 11 | Ti | — | 210 | 25 | 0.84 | double | 1.06 | 13.1 | 0 | 0.3 | 205 |
| Example 12 | Ti | — | 210 | 25 | 0.84 | double | 1.06 | 13.1 | 0.3 | 0 | 205 |
| Example 13 | Ti | — | 210 | 25 | 0.84 | double | 1.06 | 13.1 | 0.3 | 0.3 | 205 |
| Comparative Example 5 | Ti | — | 210 | 10 | 0.73 | double | 1.18 | 12.0 | 4 | 1 | 220 |
| Example 14 | Ti | — | 210 | 15 | 0.75 | double | 1.18 | 12.0 | 4 | 1 | 220 |
| Example 15 | Ti | — | 210 | 24 | 0.83 | double | 1.18 | 12.0 | 4 | 1 | 220 |
| Example 16 | Ti | — | 210 | 50 | 0.91 | double | 1.18 | 12.0 | 4 | 1 | 220 |
| Comparative Example 6 | Ti | — | 210 | 80 | 0.93 | double | 1.18 | 12.0 | 4 | 1 | 220 |
| Example 17 | Sb | — | 190 | 35 | 0.81 | double | 1.13 | 13.3 | 1 | 4 | 210 |
| Example 18 | Sb | — | 190 | 35 | 0.81 | double | 1.13 | 13.3 | 1 | 4 | 210 |
| Example 19 | Sb | — | 190 | 35 | 0.81 | double | 1.13 | 13.3 | 1 | 4 | 210 |
| Example 20 | Al | — | 230 | 10 | 0.87 | double | 1.08 | 13.9 | 0.5 | 3 | 215 |
| Example 21 | Al | — | 230 | 10 | 0.87 | double | 1.08 | 13.9 | 0.5 | 3 | 215 |
| Example 22 | Al | — | 230 | 10 | 0.87 | double | 1.08 | 13.9 | 0.5 | 3 | 215 |
| Example 23 | Ti | — | 200 | 40 | 0.82 | double | 1.09 | 12.5 | 3 | 0.7 | 210 |
| Example 24 | Sb | — | 200 | 40 | 0.82 | double | 1.09 | 12.5 | 3 | 0.7 | 210 |
| Example 25 | Al | — | 200 | 40 | 0.82 | double | 1.09 | 12.5 | 3 | 0.7 | 210 |
| Example 26 | Ti | — | 200 | 45 | 0.85 | double | 1.09 | 12.5 | 4 | 2 | 210 |

TABLE 1-continued

| | | | | | | | | | | | |
|---|---|---|---|---|---|---|---|---|---|---|---|
| Example 27 | Ti | — | 210 | 30 | 0.85 | double | 1.09 | 12.5 | 4 | 2 | 210 |
| Example 28 | Ti | — | 225 | 15 | 0.85 | double | 1.09 | 12.5 | 4 | 2 | 210 |

| | Polyester Film Production Method Heat Treatment | | | | | Physical Properties of Formed Film | |
|---|---|---|---|---|---|---|---|
| | method | operation mode | temperature Ts (° C.) | time (min) | transport tension (kg/m) | Δ Cp (J/g) | IV |
| Comparative Example 1 | heat treatment combined with coating | on-line | 160 | 3 | 9 | 0.050 | 0.80 |
| Example 1 | heat treatment combined with coating | on-line | 160 | 3 | 9 | 0.060 | 0.80 |
| Example 2 | heat treatment combined with coating | on-line | 160 | 3 | 9 | 0.065 | 0.80 |
| Example 3 | heat treatment combined with coating | on-line | 160 | 3 | 9 | 0.080 | 0.80 |
| Example 4 | heat treatment combined with coating | on-line | 160 | 3 | 9 | 0.095 | 0.80 |
| Example 5 | heat treatment combined with coating | on-line | 160 | 3 | 9 | 0.100 | 0.80 |
| Comparative Example 2 | heat treatment combined with coating | on-line | 160 | 3 | 9 | 0.110 | 0.80 |
| Comparative Example 3 | heat treatment alone | on-line | 180 | 1 | 6 | 0.050 | 0.80 |
| Example 6 | heat treatment alone | on-line | 180 | 1 | 6 | 0.060 | 0.80 |
| Example 7 | heat treatment alone | on-line | 180 | 1 | 6 | 0.065 | 0.80 |
| Example 8 | heat treatment alone | on-line | 180 | 1 | 6 | 0.075 | 0.80 |
| Example 9 | heat treatment alone | on-line | 180 | 1 | 6 | 0.095 | 0.80 |
| Example 10 | heat treatment alone | on-line | 180 | 1 | 6 | 0.100 | 0.80 |
| Comparative Example 4 | heat treatment alone | on-line | 180 | 1 | 6 | 0.110 | 0.80 |
| Example 11 | heat treatment combined with coating | on-line | 130 | 5 | 12 | 0.065 | 0.80 |
| Example 12 | heat treatment combined with coating | on-line | 130 | 5 | 12 | 0.065 | 0.80 |
| Example 13 | heat treatment combined with coating | on-line | 130 | 5 | 12 | 0.085 | 0.80 |
| Comparative Example 5 | heat treatment combined with coating | on-line | 145 | 2 | 4 | 0.050 | 0.71 |
| Example 14 | heat treatment combined with coating | on-line | 145 | 2 | 4 | 0.062 | 0.73 |
| Example 15 | heat treatment combined with coating | on-line | 145 | 2 | 4 | 0.083 | 0.81 |
| Example 16 | heat treatment combined with coating | on-line | 145 | 2 | 4 | 0.098 | 0.90 |
| Comparative Example 6 | heat treatment combined with coating | on-line | 145 | 2 | 4 | 0.120 | 0.92 |
| Example 17 | heat treatment combined with coating | off-line | 100 | 10 | 5 | 0.086 | 0.77 |
| Example 18 | heat treatment combined with coating | off-line | 150 | 3 | 5 | 0.086 | 0.77 |
| Example 19 | heat treatment combined with coating | off-line | 200 | 0.5 | 5 | 0.086 | 0.77 |
| Example 20 | heat treatment alone | on-line | 150 | 1 | 1 | 0.078 | 0.85 |
| Example 21 | heat treatment alone | on-line | 150 | 1 | 10 | 0.078 | 0.85 |
| Example 22 | heat treatment alone | on-line | 150 | 1 | 20 | 0.078 | 0.85 |
| Example 23 | heat treatment combined with coating | off-line | 170 | 0.8 | 10 | 0.073 | 0.79 |
| Example 24 | heat treatment combined with coating | off-line | 170 | 0.8 | 10 | 0.073 | 0.79 |
| Example 25 | heat treatment combined with coating | off-line | 170 | 0.8 | 10 | 0.073 | 0.79 |
| Example 26 | heat treatment combined with coating | on-line | 130 | 2 | 6 | 0.066 | 0.82 |
| Example 27 | heat treatment combined with coating | on-line | 130 | 2 | 6 | 0.082 | 0.82 |
| Example 28 | heat treatment combined with coating | on-line | 130 | 2 | 6 | 0.067 | 0.82 |

| | Physical Properties of Formed Film | | | | | | |
|---|---|---|---|---|---|---|---|
| | Δ IV (dL/g) | AV (eq/ton) | Thermal Shrinkage (%) | Weatherability Time before thermal shrinkage treatment (hr) | (before thermal shrinkage treatment)-(after thermal shrinkage treatment) (hr) | Haze (%) | Thickness (micron) | Surface Condition (number of corrugated waves) |
| Comparative Example 1 | 0.04 | 12 | 0.60 | 65 | 30 | 0.5 | 50 | 20 |
| Example 1 | 0.04 | 12 | 0.50 | 75 | 10 | 0.5 | 50 | 5 |
| Example 2 | 0.04 | 12 | 0.43 | 80 | 5 | 0.4 | 50 | 3 |
| Example 3 | 0.04 | 12 | 0.25 | 120 | 0 | 0.5 | 50 | 0 |
| Example 4 | 0.04 | 12 | 0.12 | 140 | 4 | 0.6 | 50 | 2 |
| Example 5 | 0.04 | 12 | 0.06 | 150 | 10 | 0.5 | 50 | 4 |
| Comparative Example 2 | 0.04 | 12 | 0.00 | 160 | 50 | 0.5 | 50 | 18 |
| Comparative Example 3 | 0.04 | 12 | 0.60 | 70 | 33 | 0.7 | 75 | 20 |
| Example 6 | 0.04 | 12 | 0.50 | 75 | 9 | 0.8 | 75 | 6 |
| Example 7 | 0.04 | 12 | 0.44 | 82 | 4 | 0.6 | 75 | 3 |
| Example 8 | 0.04 | 12 | 0.29 | 110 | 0 | 0.8 | 75 | 0 |
| Example 9 | 0.04 | 12 | 0.14 | 145 | 4 | 0.7 | 75 | 3 |

TABLE 1-continued

|  | | | | | | | | |
|---|---|---|---|---|---|---|---|---|
| Example 10 | 0.04 | 12 | 0.06 | 150 | 11 | 0.7 | 75 | 5 |
| Comparative Example 4 | 0.04 | 12 | 0.00 | 155 | 45 | 0.8 | 75 | 19 |
| Example 11 | 0.04 | 12 | 0.47 | 76 | 9 | 0.7 | 125 | 6 |
| Example 12 | 0.04 | 12 | 0.46 | 78 | 8 | 0.8 | 125 | 6 |
| Example 13 | 0.04 | 12 | 0.18 | 126 | 0 | 0.7 | 125 | 0 |
| Comparative Example 5 | 0.02 | 17 | 0.56 | 71 | 34 | 0.5 | 125 | 19 |
| Example 14 | 0.02 | 17 | 0.44 | 83 | 11 | 0.6 | 125 | 3 |
| Example 15 | 0.02 | 17 | 0.32 | 101 | 0 | 0.7 | 125 | 0 |
| Example 16 | 0.01 | 17 | 0.48 | 142 | 7 | 0.8 | 125 | 2 |
| Comparative Example 6 | 0.01 | 17 | 0.53 | 163 | 46 | 0.6 | 125 | 17 |
| Example 17 | 0.04 | 19 | 0.24 | 115 | 0 | 0.7 | 450 | 0 |
| Example 18 | 0.04 | 19 | 0.35 | 115 | 0 | 0.6 | 450 | 0 |
| Example 19 | 0.04 | 19 | 0.33 | 115 | 0 | 0.9 | 450 | 0 |
| Example 20 | 0.02 | 8 | 0.48 | 126 | 4 | 0.5 | 300 | 5 |
| Example 21 | 0.02 | 8 | 0.19 | 125 | 0 | 0.6 | 300 | 0 |
| Example 22 | 0.02 | 8 | 0.06 | 126 | 3 | 0.5 | 300 | 5 |
| Example 23 | 0.03 | 10 | 0.25 | 125 | 0 | 0.6 | 250 | 0 |
| Example 24 | 0.03 | 10 | 0.45 | 126 | 5 | 1.2 | 250 | 3 |
| Example 25 | 0.03 | 10 | 0.46 | 78 | 7 | 0.3 | 250 | 5 |
| Example 26 | 0.03 | 5 | 0.47 | 142 | 9 | 0.5 | 175 | 3 |
| Example 27 | 0.03 | 11 | 0.22 | 115 | 0 | 0.7 | 175 | 0 |
| Example 28 | 0.03 | 21 | 0.46 | 78 | 4 | 1 | 175 | 3 |

TABLE 2

| | Polyester Film Production Method | | | | | | | Thermal Fixation | | |
|---|---|---|---|---|---|---|---|---|---|---|
| | | EG | Solid-Phase Polymerization | | | | Draw Ratio in Stretching | | | |
| | Esterification Catalyst | Amount in Resin (ppm) | temperature ((C.) | time (hr) | IV of Resin (dL/g) | Extruder | lateral/ longitudinal | areal draw ratio | local temperature unevenness (° C.) | wind speed unevenness (%) | temperature Tk (° C.) |
| Example 29 | Ti | — | 210 | 25 | 0.84 | double | 1.09 | 12.5 | 4 | 1.5 | 210 |
| Example 30 | Ti | — | 210 | 25 | 0.84 | double | 1.09 | 12.5 | 4 | 1.5 | 210 |
| Example 31 | Ti | — | 210 | 25 | 0.84 | double | 1.09 | 12.5 | 4 | 1.5 | 210 |
| Example 32 | Ti | — | 210 | 25 | 0.84 | double | 1.03 | 12.5 | 2 | 2 | 215 |
| Example 33 | Ti | — | 210 | 25 | 0.84 | double | 1.05 | 12.5 | 2 | 2 | 215 |
| Example 34 | Ti | — | 210 | 25 | 0.84 | double | 1.10 | 12.5 | 2 | 2 | 215 |
| Example 35 | Ti | — | 210 | 25 | 0.84 | double | 1.25 | 12.5 | 2 | 2 | 215 |
| Example 36 | Ti | — | 210 | 25 | 0.84 | double | 1.30 | 12.5 | 2 | 2 | 215 |
| Example 37 | Ti | — | 210 | 25 | 0.84 | double | 1.15 | 11.0 | 3 | 3 | 205 |
| Example 38 | Ti | — | 210 | 25 | 0.84 | double | 1.15 | 11.5 | 3 | 3 | 205 |
| Example 39 | Ti | — | 210 | 25 | 0.84 | double | 1.15 | 11.3 | 3 | 3 | 205 |
| Example 40 | Ti | — | 210 | 25 | 0.84 | double | 1.15 | 14.5 | 3 | 3 | 205 |
| Example 41 | Ti | — | 210 | 25 | 0.84 | double | 1.15 | 15.0 | 3 | 3 | 205 |
| Example 42 | Ti | — | 210 | 25 | 0.84 | double | 1.15 | 18.0 | 3 | 3 | 205 |
| Example 43 | Ti | — | 210 | 25 | 0.84 | double | 1.20 | 13.5 | 1 | 5 | 195 |
| Example 44 | Ti | — | 210 | 25 | 0.84 | double | 1.20 | 13.5 | 1 | 5 | 200 |
| Example 45 | Ti | — | 210 | 25 | 0.84 | double | 1.20 | 13.5 | 1 | 5 | 210 |
| Example 46 | Ti | — | 210 | 25 | 0.84 | double | 1.20 | 13.5 | 1 | 5 | 225 |
| Example 47 | Ti | — | 210 | 25 | 0.84 | double | 1.20 | 13.5 | 1 | 5 | 230 |
| Example 48 | Ti | — | 210 | 25 | 0.84 | double | 1.09 | 12.6 | 1 | 1 | 210 |
| Example 49 | Ti | — | 210 | 25 | 0.84 | double | 1.09 | 12.6 | 1 | 1 | 210 |
| Example 50 | Ti | — | 210 | 25 | 0.84 | double | 1.09 | 12.6 | 1 | 1 | 210 |
| Example 51 | Ti | — | 210 | 25 | 0.84 | double | 1.09 | 12.6 | 1 | 1 | 210 |
| Example 52 | Ti | — | 210 | 25 | 0.84 | double | 1.09 | 12.6 | 1 | 1 | 210 |
| Comparative Example 7 | Sb | — | undone | 0 | 0.71 | single | 1.06 | 13.7 | 0 | 0 | 190 |
| Example 53 | Sb | — | 210 | 28 | 0.85 | double | 1.06 | 13.7 | 2 | 3 | 205 |
| Comparative Example 8 | Sb | — | 230 | 100 | 1.41 | single | 1.17 | 10.5 | 0 | 0 | 235 |
| Example 54 | Sb | — | 230 | 14 | 0.86 | double | 1.17 | 13.0 | 3 | 2 | 210 |
| Comparative Example 9 | Sb | | weather-resistant polyester film (Toray's Lumirror X10S) | | | | | | | | |
| Example 55 | Sb | — | 215 | 25 | 0.85 | double | 1.01 | 12.8 | 1.2 | 3.2 | 215 |
| Example 56 | Ti | 900 | 210 | 24 | 0.82 | double | 1.18 | 13.0 | 4 | 1 | 220 |
| Example 57 | Ti | 700 | 210 | 24 | 0.82 | double | 1.18 | 13.0 | 4 | 1 | 220 |

TABLE 2-continued

| | | | | | | | | | | | |
|---|---|---|---|---|---|---|---|---|---|---|---|
| Example 58 | Ti | 250 | 210 | 24 | 0.82 | double | 1.18 | 13.0 | 4 | 1 | 220 |
| Example 59 | Ti | 40 | 210 | 24 | 0.82 | double | 1.18 | 13.0 | 4 | 1 | 220 |
| Example 60 | Ti | — | 210 | 24 | 0.82 | double | 1.18 | 13.0 | 4 | 1 | 220 |

| | Polyester Film Production Method Heat Treatment | | | | | Physical Properties of Formed Film | |
|---|---|---|---|---|---|---|---|
| | method | operation mode | temperature Ts (° C.) | time (min) | transport tension (kg/m) | Δ Cp (J/g) | IV |
| Example 29 | heat treatment alone | off-line | 120 | 5 | 8 | 0.068 | 0.80 |
| Example 30 | heat treatment combined with coating | off-line | 120 | 5 | 8 | 0.075 | 0.80 |
| Example 31 | heat treatment combined with coating | on-line | 120 | 5 | 8 | 0.075 | 0.80 |
| Example 32 | heat treatment alone | on-line | 140 | 5 | 9 | 0.065 | 0.80 |
| Example 33 | heat treatment alone | on-line | 140 | 5 | 9 | 0.068 | 0.80 |
| Example 34 | heat treatment alone | on-line | 140 | 5 | 9 | 0.073 | 0.80 |
| Example 35 | heat treatment alone | on-line | 140 | 5 | 9 | 0.067 | 0.80 |
| Example 36 | heat treatment alone | on-line | 140 | 5 | 9 | 0.065 | 0.80 |
| Example 37 | heat treatment combined with coating | on-line | 160 | 3 | 7 | 0.063 | 0.80 |
| Example 38 | heat treatment combined with coating | on-line | 160 | 3 | 7 | 0.065 | 0.80 |
| Example 39 | heat treatment combined with coating | on-line | 160 | 3 | 7 | 0.075 | 0.80 |
| Example 40 | heat treatment combined with coating | on-line | 160 | 3 | 7 | 0.067 | 0.80 |
| Example 41 | heat treatment combined with coating | on-line | 160 | 3 | 7 | 0.063 | 0.80 |
| Example 42 | heat treatment combined with coating | on-line | 160 | 3 | 7 | 0.061 | 0.80 |
| Example 43 | heat treatment alone | on-line | 170 | 2 | 5 | 0.062 | 0.80 |
| Example 44 | heat treatment alone | on-line | 170 | 2 | 5 | 0.066 | 0.80 |
| Example 45 | heat treatment alone | on-line | 170 | 2 | 5 | 0.082 | 0.80 |
| Example 46 | heat treatment alone | on-line | 170 | 2 | 5 | 0.066 | 0.80 |
| Example 47 | heat treatment alone | on-line | 170 | 2 | 5 | 0.063 | 0.80 |
| Example 48 | heat treatment combined with coating | on-line | 160 | 3 | 9 | 0.080 | 0.80 |
| Example 49 | heat treatment combined with coating | on-line | 160 | 3 | 9 | 0.075 | 0.80 |
| Example 50 | heat treatment combined with coating | on-line | 160 | 3 | 9 | 0.070 | 0.80 |
| Example 51 | heat treatment combined with coating | on-line | 160 | 3 | 9 | 0.065 | 0.80 |
| Example 52 | heat treatment combined with coating | on-line | 160 | 3 | 9 | 0.060 | 0.80 |
| Comparative Example 7 | heat treatment alone | on-line | 190 | 1 | 3 | 0.045 | 0.65 |
| Example 53 | heat treatment alone | on-line | 190 | 1 | 3 | 0.075 | 0.82 |
| Comparative Example 8 | heat treatment alone | off-line | 150 | 0.4 | 25 | 0.050 | 1.40 |
| Example 54 | heat treatment alone | off-line | 150 | 1 | 5 | 0.081 | 0.83 |
| Comparative Example 9 | weather-resistant polyester film (Toray's Lumirror X10S) | | | | | 0.080 | 0.71 |
| Example 55 | heat treatment alone | on-line | 180 | 1 | 6 | 0.080 | 0.82 |
| Example 56 | heat treatment combined with coating | on-line | 140 | 2 | 5 | 0.062 | 0.79 |
| Example 57 | heat treatment combined with coating | on-line | 140 | 2 | 5 | 0.067 | 0.79 |
| Example 58 | heat treatment combined with coating | on-line | 140 | 2 | 5 | 0.081 | 0.79 |
| Example 59 | heat treatment combined with coating | on-line | 140 | 2 | 5 | 0.093 | 0.79 |
| Example 60 | heat treatment combined with coating | on-line | 140 | 2 | 5 | 0.098 | 0.79 |

| | Physical Properties of Formed Film | | | | | | |
|---|---|---|---|---|---|---|---|
| | Δ IV (dL/g) | AV (eq/ton) | Thermal Shrinkage (%) | Weatherability Time before thermal shrinkage treatment (hr) | (before thermal shrinkage treatment)- (after thermal shrinkage treatment) (hr) | Haze (%) | Thickness (micron) | Surface Condition (number of corrugated waves) |
| Example 29 | 0.04 | 21 | 0.45 | 95 | 3 | 0.4 | 100 | 2 |
| Example 30 | 0.04 | 21 | 0.42 | 97 | 1 | 0.6 | 100 | 1 |
| Example 31 | 0.04 | 21 | 0.37 | 98 | 0 | 0.7 | 100 | 0 |
| Example 32 | 0.04 | 12 | 0.47 | 78 | 5 | 0.7 | 125 | 4 |
| Example 33 | 0.04 | 12 | 0.43 | 82 | 2 | 0.8 | 125 | 2 |
| Example 34 | 0.04 | 12 | 0.24 | 95 | 0 | 0.7 | 125 | 0 |
| Example 35 | 0.04 | 12 | 0.41 | 138 | 5 | 0.9 | 125 | 2 |
| Example 36 | 0.04 | 12 | 0.46 | 145 | 9 | 0.8 | 125 | 5 |
| Example 37 | 0.04 | 12 | 0.48 | 77 | 4 | 0.7 | 60 | 4 |
| Example 38 | 0.04 | 12 | 0.42 | 84 | 2 | 0.8 | 60 | 2 |
| Example 39 | 0.04 | 12 | 0.29 | 125 | 0 | 0.9 | 60 | 0 |
| Example 40 | 0.04 | 12 | 0.42 | 139 | 6 | 1.1 | 60 | 3 |
| Example 41 | 0.04 | 12 | 0.48 | 146 | 10 | 1.2 | 60 | 5 |
| Example 42 | 0.04 | 12 | 0.49 | 149 | 10 | 1.2 | 60 | 5 |
| Example 43 | 0.04 | 12 | 0.47 | 78 | 6 | 0.5 | 85 | 4 |
| Example 44 | 0.04 | 12 | 0.42 | 83 | 3 | 0.8 | 85 | 2 |

TABLE 2-continued

| | | | | | | | | | |
|---|---|---|---|---|---|---|---|---|---|
| Example 45 | 0.04 | 12 | 0.28 | 126 | 0 | 0.9 | 85 | 0 | |
| Example 46 | 0.04 | 12 | 0.41 | 84 | 4 | 1 | 85 | 2 | |
| Example 47 | 0.04 | 12 | 0.47 | 77 | 7 | 1.1 | 85 | 5 | |
| Example 48 | 0.04 | 12 | 0.20 | 125 | 2 | 5 | 100 | 1 | |
| Example 49 | 0.04 | 12 | 0.25 | 115 | 3 | 15 | 100 | 1 | |
| Example 50 | 0.04 | 12 | 0.42 | 83 | 4 | 25 | 100 | 3 | |
| Example 51 | 0.04 | 12 | 0.48 | 78 | 7 | 35 | 100 | 5 | |
| Example 52 | 0.04 | 12 | 0.59 | 75 | 10 | 50 | 100 | 8 | |
| Comparative Example 7 | 0.06 | 45 | 4.10 | 55 | 30 | 1.5 | 25 | 30 | |
| Example 53 | 0.04 | 18 | 0.35 | 115 | 0 | 0.5 | 30 | 0 | |
| Comparative Example 8 | 0.01 | 12 | 0.20 | 80 | 30 | 1.2 | 50 | 21 | |
| Example 54 | 0.03 | 12 | 0.25 | 85 | 0 | 0.3 | 50 | 0 | |
| Comparative Example 9 | — | 23 | 1.80 | 70 | 33 | 80 | 75 | 19 | |
| Example 55 | 0.04 | 16 | 0.40 | 85 | 0 | 0.8 | 75 | 0 | |
| Example 56 | 0.03 | 4 | 0.48 | 145 | 15 | 0.9 | 90 | 5 | |
| Example 57 | 0.03 | 5 | 0.42 | 138 | 7 | 0.7 | 90 | 2 | |
| Example 58 | 0.03 | 12 | 0.21 | 125 | 0 | 0.5 | 90 | 0 | |
| Example 59 | 0.03 | 21 | 0.43 | 82 | 6 | 0.7 | 90 | 3 | |
| Example 60 | 0.03 | 22 | 0.48 | 77 | 10 | 1 | 90 | 6 | |

TABLE 3

| | | EG Amount in Resin (ppm) | Trifunctional or more polyfunctional constitutive ingredient | | Solid-Phase Polymerization temperature (°C) | time (hr) | IV of Resin (dL/g) | Polyester Film Production Method | | | Draw Ratio in Stretching | |
|---|---|---|---|---|---|---|---|---|---|---|---|---|
| | Esterification Catalyst | | Material | Amount (mol %) | | | | Extruder | Terminal Blocking Agent | | lateral/longitudinal | areal draw ratio |
| | | | | | | | | | Material | Amount (mol %) | | |
| Example 61 | Sb | — | TMA | 0.004 | 210 | 25 | 0.84 | double | — | — | 1.09 | 12.6 |
| Example 62 | Sb | 900 | TMA | 0.005 | 210 | 25 | 0.82 | double | — | — | 1.09 | 12.6 |
| Example 63 | Sb | 700 | TMA | 0.15 | 210 | 25 | 0.82 | double | — | — | 1.09 | 12.6 |
| Example 64 | Sb | 250 | TMA | 2.5 | 210 | 25 | 0.82 | double | — | — | 1.09 | 12.6 |
| Example 65 | Sb | 40 | TMA | 2.6 | 210 | 25 | 0.82 | double | — | — | 1.09 | 12.6 |
| Example 66 | Sb | — | BTC | 0.15 | 210 | 25 | 0.82 | double | — | — | 1.09 | 12.6 |
| Example 67 | Sb | — | EPC | 0.15 | 210 | 25 | 0.81 | double | — | — | 1.09 | 12.6 |
| Example 68 | Sb | — | CHC | 0.15 | 210 | 25 | 0.82 | double | — | — | 1.09 | 12.6 |
| Example 69 | Sb | — | THB | 0.15 | 210 | 25 | 0.83 | double | — | — | 1.09 | 12.6 |
| Example 70 | Sb | — | PE | 0.15 | 210 | 25 | 0.83 | double | — | — | 1.09 | 12.6 |
| Example 71 | Sb | — | — | — | 210 | 25 | 0.86 | double | Cl | 0.05 | 1.09 | 12.6 |
| Example 72 | Sb | — | — | — | 210 | 25 | 0.87 | double | Cl | 0.1 | 1.09 | 12.6 |
| Example 73 | Sb | — | — | — | 210 | 25 | 0.86 | double | Cl | 1 | 1.09 | 12.6 |
| Example 74 | Sb | — | — | — | 210 | 25 | 0.87 | double | Cl | 5 | 1.09 | 12.6 |
| Example 75 | Sb | — | — | — | 210 | 25 | 0.88 | double | Cl | 6 | 1.09 | 12.6 |
| Example 76 | Sb | — | — | — | 210 | 25 | 0.85 | double | EP | 1 | 1.09 | 12.6 |
| Example 77 | Sb | — | — | — | 210 | 25 | 0.86 | double | OX | 1 | 1.09 | 12.6 |
| Example 78 | Sb | — | TMA | 0.1 | 210 | 25 | 0.90 | double | Cl | 0.5 | 1.09 | 12.6 |
| Compartive Example 10 | Sb | — | TMA | 0.1 | 210 | 25 | 0.90 | double | Cl | 0.5 | 1.09 | 12.6 |
| Example 79 | Sb | — | TMA | 0.15 | 210 | 25 | 0.87 | double | — | — | 1.09 | 12.6 |
| Example 80 | Sb | — | — | — | 210 | 25 | 0.86 | double | Cl | 1 | 1.09 | 12.6 |
| Example 81 | Ti | — | — | — | 210 | 25 | 0.85 | double | — | — | 1.09 | 12.6 |
| Example 82 | Ti | — | — | — | 210 | 25 | 0.85 | double | — | — | 1.09 | 12.6 |
| Example 83 | Ti | — | — | — | 210 | 25 | 0.85 | double | — | — | 1.09 | 12.6 |
| Example 84 | Ti | — | — | — | 210 | 25 | 0.85 | double | — | — | 1.09 | 12.6 |
| Example 85 | Ti | — | — | — | 210 | 25 | 0.85 | double | — | — | 1.09 | 12.6 |
| Example 86 | Ti | — | — | — | 210 | 25 | 0.85 | double | — | — | 1.09 | 12.6 |
| Example 87 | Ti | — | — | — | 210 | 25 | 0.85 | double | — | — | 1.09 | 12.6 |
| Example 88 | Ti | 0 | — | — | 210 | 25 | 0.85 | single | — | — | 1.09 | 12.6 |
| Example 89 | Ti | 1 | — | — | 210 | 25 | 0.85 | single | — | — | 1.09 | 12.6 |
| Example 90 | Ti | 20 | — | — | 210 | 25 | 0.85 | single | — | — | 1.09 | 12.6 |
| Example 91 | Ti | 100 | — | — | 210 | 25 | 0.85 | single | — | — | 1.09 | 12.6 |
| Example 92 | Ti | 1500 | — | — | 210 | 25 | 0.85 | single | — | — | 1.09 | 12.6 |

TABLE 3-continued

| | | | | | | | | | | | | |
|---|---|---|---|---|---|---|---|---|---|---|---|---|
| Example 93 | Ti | 9000 | — | — | 210 | 25 | 0.85 | single | — | — | 1.09 | 12.6 |
| Example 94 | Ti | 300 | — | — | 210 | 25 | 0.85 | double | — | — | 1.09 | 12.6 |

Polyester Film Production Method

| | Thermal Fixation | | | | Heat Treatment | | | | | Physical Properties of Formed Film | |
|---|---|---|---|---|---|---|---|---|---|---|---|
| | local temperature unevenness ((C.) | | | | | | | | | | |
| | Longitudinal Width direction | wind direction | speed unevenness (%) | temperature Tk (° C.) | method | operation mode | temperature TS (C.) | time (min) | transport tension (kg/m) | Δ Cp (J/g) | IV |
| Example 61 | 0.1 | 0 | 0 | 210 | coating alone | on-line | 160 | 3 | 9 | 0.06 | 0.81 |
| Example 62 | 0.1 | 0 | 0 | 210 | coating alone | on-line | 160 | 3 | 9 | 0.065 | 0.79 |
| Example 63 | 0.1 | 0 | 0 | 210 | coating alone | on-line | 160 | 3 | 9 | 0.08 | 0.80 |
| Example 64 | 0.1 | 0 | 0 | 215 | coating alone | on-line | 160 | 3 | 9 | 0.95 | 0.81 |
| Example 65 | 0.1 | 0 | 0 | 215 | coating alone | on-line | 160 | 3 | 9 | 0.1 | 0.78 |
| Example 66 | 0.1 | 0 | 0 | 215 | coating alone | on-line | 160 | 3 | 9 | 0.06 | 0.77 |
| Example 67 | 0.1 | 0 | 0 | 215 | coating alone | on-line | 160 | 3 | 9 | 0.065 | 0.74 |
| Example 68 | 0.1 | 0 | 0 | 215 | coating alone | on-line | 160 | 3 | 9 | 0.062 | 0.78 |
| Example 69 | 0.1 | 0 | 0 | 205 | coating alone | on-line | 160 | 3 | 9 | 0.064 | 0.82 |
| Example 70 | 0.1 | 0 | 0 | 205 | coating alone | on-line | 160 | 3 | 9 | 0.064 | 0.88 |
| Example 71 | 0.1 | 0 | 0 | 205 | coating alone | on-line | 160 | 3 | 9 | 0.062 | 0.81 |
| Example 72 | 0.1 | 0 | 0 | 205 | coating alone | on-line | 160 | 3 | 9 | 0.073 | 0.82 |
| Example 73 | 0.1 | 0 | 0 | 205 | coating alone | on-line | 160 | 3 | 9 | 0.083 | 0.81 |
| Example 74 | 0.1 | 0 | 0 | 205 | coating alone | on-line | 160 | 3 | 9 | 0.092 | 0.82 |
| Example 75 | 0.1 | 0 | 0 | 195 | coating alone | on-line | 160 | 3 | 9 | 0.1 | 0.83 |
| Example 76 | 0.1 | 0 | 0 | 200 | coating alone | on-line | 160 | 3 | 9 | 0.08 | 0.8 |
| Example 77 | 0.1 | 0 | 0 | 210 | coating alone | on-line | 160 | 3 | 9 | 0.082 | 0.81 |
| Example 78 | 0.1 | 0 | 0 | 225 | coating alone | on-line | 160 | 3 | 9 | 0.082 | 0.85 |
| Compartive Example 10 | 0 | 0 | 0 | 230 | coating alone | on-line | 160 | 3 | 9 | 0.048 | 0.85 |
| Example 79 | 1 | 0 | 3 | 210 | coating alone | on-line | 160 | 3 | 9 | 0.08 | 0.82 |
| Example 80 | 1 | 0 | 3 | 210 | coating alone | on-line | 160 | 3 | 9 | 0.083 | 0.81 |
| Example 81 | 0.3 | 0.08 | 0 | 210 | coating alone | on-line | 160 | 3 | 9 | 0.065 | 0.8 |
| Example 82 | 0.3 | 0.1 | 0 | 210 | coating alone | on-line | 160 | 3 | 9 | 0.07 | 0.8 |
| Example 83 | 0.3 | 0.3 | 0 | 210 | coating alone | on-line | 160 | 3 | 9 | 0.078 | 0.8 |
| Example 84 | 0.3 | 4 | 0 | 190 | coating alone | on-line | 160 | 3 | 9 | 0.09 | 0.8 |
| Example 85 | 0.3 | 5 | 0 | 205 | coating alone | on-line | 160 | 3 | 9 | 0.094 | 0.8 |
| Example 86 | 0.3 | 10 | 0 | 235 | coating alone | on-line | 160 | 3 | 9 | 0.099 | 0.8 |
| Example 87 | 1.5 | 2 | 0 | 210 | coating alone | on-line | 160 | 3 | 9 | 0.082 | 0.8 |
| Example 88 | 1.5 | 0 | 0 | 215 | coating alone | on-line | 160 | 3 | 9 | 0.072 | 0.67 |
| Example 89 | 1.5 | 0 | 0 | 220 | coating alone | on-line | 160 | 3 | 9 | 0.074 | 0.72 |
| Example 90 | 1.5 | 0 | 0 | 220 | coating alone | on-line | 160 | 3 | 9 | 0.076 | 0.74 |
| Example 91 | 1.5 | 0 | 0 | 220 | coating alone | on-line | 160 | 3 | 9 | 0.083 | 0.78 |
| Example 92 | 1.5 | 0 | 0 | 220 | coating alone | on-line | 160 | 3 | 9 | 0.08 | 0.75 |
| Example 93 | 1.5 | 0 | 0 | 220 | coating alone | on-line | 160 | 3 | 9 | 0.078 | 0.73 |
| Example 94 | 1.5 | 0 | 0 | 220 | coating alone | on-line | 160 | 3 | 9 | 0.078 | 0.84 |

Physical Properties of Formed Film

| | Δ IV (dL/g) | AV (eq/ton) | Thermal Shrinkage (%) | Weatherability Time before thermal shrinkage treatment (hr) | (before thermal shrinkage treatment)-(after thermal shrinkage treatment) (hr) | Haze (%) | Thickness (micron) | Surface Condition (number of corrugated waves) |
|---|---|---|---|---|---|---|---|---|
| Example 61 | 0.03 | 13 | 0.5 | 75 | 10 | 0.5 | 75 | 7 |
| Example 62 | 0.03 | 13 | 0.4 | 82 | 2 | 0.4 | 75 | 3 |
| Example 63 | 0.02 | 12 | 0.2 | 110 | 0 | 0.5 | 75 | 0 |
| Example 64 | 0.01 | 12 | 0.4 | 83 | 2 | 0.5 | 75 | 4 |
| Example 65 | 0.04 | 12 | 0.5 | 76 | 9 | 0.4 | 75 | 7 |
| Example 66 | 0.05 | 13 | 0.4 | 100 | 2 | 0.5 | 75 | 2 |
| Example 67 | 0.05 | 12 | 0.4 | 105 | 1 | 0.5 | 75 | 2 |
| Example 68 | 0.05 | 13 | 0.3 | 95 | 2 | 0.6 | 75 | 1 |
| Example 69 | 0.05 | 12 | 0.4 | 100 | 1 | 0.6 | 75 | 2 |

TABLE 3-continued

|  |  |  |  |  |  |  |  |  |
|---|---|---|---|---|---|---|---|---|
| Example 70 | 0.05 | 12 | 0.4 | 95 | 2 | 0.6 | 75 | 2 |
| Example 71 | 0.05 | 12 | 0.46 | 100 | 7 | 0.4 | 50 | 8 |
| Example 72 | 0.05 | 8 | 0.4 | 115 | 2 | 0.5 | 50 | 2 |
| Example 73 | 0.05 | 5 | 0.21 | 125 | 0 | 0.5 | 50 | 0 |
| Example 74 | 0.05 | 4 | 0.41 | 110 | 3 | 0.4 | 50 | 2 |
| Example 75 | 0.05 | 5 | 0.48 | 100 | 6 | 0.5 | 50 | 7 |
| Example 76 | 0.05 | 7 | 0.32 | 125 | 1 | 0.6 | 50 | 1 |
| Example 77 | 0.05 | 7 | 0.33 | 120 | 1 | 0.6 | 50 | 1 |
| Example 78 | 0.05 | 9 | 0.24 | 125 | 2 | 0.4 | 50 | 1 |
| Compartive Example 10 | 0.05 | 10 | 0.21 | 70 | 32 | 0.6 | 50 | 19 |
| Example 79 | 0.05 | 12 | 0.17 | 130 | 0 | 0.5 | 75 | 0 |
| Example 80 | 0.05 | 5 | 0.16 | 135 | 0 | 0.5 | 75 | 0 |
| Example 81 | 0.05 | 12 | 0.43 | 65 | 5 | 0.4 | 75 | 3 |
| Example 82 | 0.05 | 12 | 0.35 | 75 | 3 | 0.4 | 75 | 1 |
| Example 83 | 0.05 | 12 | 0.024 | 125 | 0 | 0.5 | 75 | 0 |
| Example 84 | 0.05 | 12 | 0.18 | 138 | 2 | 0.4 | 75 | 1 |
| Example 85 | 0.05 | 12 | 0.11 | 145 | 3 | 0.4 | 75 | 2 |
| Example 86 | 0.05 | 12 | 0.02 | 155 | 5 | 0.5 | 75 | 4 |
| Example 87 | 0.05 | 12 | 0.18 | 135 | 0 | 0.3 | 75 | 0 |
| Example 88 | 0.18 | 20 | 0.45 | 78 | 4 | 0.4 | 125 | 4 |
| Example 89 | 0.13 | 19 | 0.38 | 84 | 3 | 0.4 | 125 | 3 |
| Example 90 | 0.11 | 16 | 0.31 | 88 | 2 | 0.5 | 125 | 2 |
| Example 91 | 0.07 | 12 | 0.21 | 110 | 1 | 0.4 | 125 | 1 |
| Example 92 | 0.1 | 16 | 0.3 | 84 | 2 | 0.4 | 125 | 2 |
| Example 93 | 0.12 | 18 | 0.39 | 81 | 3 | 0.5 | 125 | 3 |
| Example 94 | 0.01 | 10 | 0.07 | 129 | 0 | 0.3 | 125 | 0 |

From Tables 1 to 3, it is known that the polyester films of Examples 1 to 80 are all excellent in weather resistance and have good surface planarity and a low thermal shrinkage. In particular, these films are characterized in that, even after they are processed for thermal shrinkage treatment to reduce the thermal shrinkage, their weather resistance lowers little. On the other hand, the films of Comparative Examples 1 to 8, of which ΔCp falls outside the scope of the invention, all have poor surface planarity and are unsatisfactory in point of the weather resistance and the thermal shrinkage. In the film of Comparative Example 9, IV is outside the scope of the invention, and therefore this film has poor surface planarity and is unsatisfactory in point of the weather resistance and the thermal shrinkage like those of the other Comparative Examples.

Comparing Comparative Example 10 and Example 78 has revealed that mere addition of the terminal blocking agent or the trifunctional or more polyfunctional constitutive ingredient with impartation of neither local temperature fluctuation nor wind speed fluctuation during the thermal fixation could not control ΔCp to fall within the range defined in the invention. Not adhering to any theory, it is anticipated that the addition of the terminal blocking agent or the trifunctional or more polyfunctional constitutive ingredient could control only the terminal part of the polyester resin molecule but could not change the entire structure of the polyester resin molecule to thereby change the bulk property thereof, and as a result, the addition could not increase ΔCp up to the range defined in the invention.

It is also known that the above-mentioned polyester films of the invention can be produced according to the production method of the invention.

(3) Construction of Solar Cell Module

The polyester film of Examples and Comparative Examples was used as a backsheet to construct a 30 cm-square solar cell module. Concretely, the backsheet of the film was stuck to a transparent filler (EVA, ethylene-vinyl copolymer as sealant) to form the structure as in FIG. 1 in JP-A 2009-158952. In this, the easy adhesion layer of the backsheet was made to face the transparent filler of encapsulating the solar cell element.

The solar cell module thus constructed to comprise the backsheet was evaluated as follows.

(Peeling)

The solar cell module constructed as above was left in an environmental condition at 120° C. and at a relative humidity of 100% for 75 hours, and then the area of the region where the backsheet peeled off from EVA (ethylene-vinyl acetate copolymer as sealant) was measured. The measured value was computed to give the proportion thereof per the entire area of the solar cell module.

As a result, in the samples of the invention, the peeling was retarded, and the polyester film of the invention is resistant to long-term use. As opposed to this, it was impossible to completely prevent the peeling of the polyester film of Comparative Examples.

INDUSTRIAL APPLICABILITY

The polyester film of the invention is favorably used, for example, as a backsheet of a solar cell module (that is, as the sheet to be disposed in a solar cell module on the side opposite to the sunlight coming side of the solar cell element therein).

While the present invention has been described in detail and with reference to specific embodiments thereof, it will be apparent to one skilled in the art that various changes and modifications can be made therein without departing from the spirit and scope thereof.

The present disclosure relates to the subject matter contained in Japanese Patent Application No. 2010-134470 filed on Jun. 11, 2010, and Japanese Patent Application No. 2011-122235 filed on May 31, 2011, the contents of which are expressly incorporated herein by reference in their entirety. All the publications referred to in the present specification are also expressly incorporated herein by reference in their entirety.

The foregoing description of preferred embodiments of the invention has been presented for purposes of illustration and description, and is not intended to be exhaustive or to limit the invention to the precise form disclosed. The description was selected to best explain the principles of the invention and their practical application to enable others skilled in the art to best utilize the invention in various embodiments and various modifications as are suited to the particular use contemplated. It is intended that the scope of the invention not be limited by the specification, but be defined claims set forth below.

What is claimed is:

1. A polyester film comprising a polyester resin wherein:
   the polyester film has a specific heat change at 85° C. to 135° C. (ΔCp) of from 0.06 to 0.1 J/g, and
   the polyester resin has an intrinsic viscosity IV of from 0.73 to 0.9 dL/g.

2. The polyester film according to claim 1, wherein the polyester resin has a terminal carboxyl group content AV of from 5 to 21 eq/ton.

3. The polyester film according to claim 1, having a thermal shrinkage of from 0.05 to 0.5%.

4. The polyester film according to claim 1, wherein the heat treatment time for which the polyester film is heat-treated at 120° C. and at a relative humidity of 100% and maintains 50% retention of elongation at break after the heat treatment is from 75 hours to 150 hours.

5. The polyester film according to claim 1, having a haze of from 0.1 to 40%.

6. The polyester film according to claim 1, comprising a trifunctional or more polyfunctional constitutive ingredient, in which the total of the carboxyl acid groups and the hydroxyl groups in one molecule is at least 3, in an amount of from 0.005 mol % to 2.5 mol % of the polyester film.

7. The polyester film according to claim 1, containing at least one terminal blocking agent of isocyanate compounds, carbodiimide compounds and epoxy compounds, in an amount of from 0.1% by mass to 5% by mass of the polyester film.

8. A backsheet for solar cells, comprising a polyester film comprising a polyester resin wherein the polyester film has a specific heat change at 85° C. to 135° C. (ΔCp) of from 0.06 to 0.1 J/g, and the polyester resin has an intrinsic viscosity IV of from 0.73 to 0.9 dL/g.

9. A solar cell module, comprising a polyester film comprising a polyester resin wherein the polyester film has a specific heat change at 85° C. to 135° C. (ΔCp) of from 0.06 to 0.1 J/g, and the polyester resin has an intrinsic viscosity IV of from 0.73 to 0.9 dL/g.

* * * * *